(12) United States Patent
Nishino et al.

(10) Patent No.: US 11,533,445 B2
(45) Date of Patent: Dec. 20, 2022

(54) SOLID-STATE IMAGE SENSOR AND ELECTRONIC DEVICE

(71) Applicant: Sony Semiconductor Solutions Corporation, Kanagawa (JP)

(72) Inventors: Tatsuki Nishino, Kanagawa (JP); Hiroki Hiyama, Kanagawa (JP); Shizunori Matsumoto, Kanagawa (JP); Takahiro Miura, Kanagawa (JP); Akihiko Miyanohara, Tokyo (JP); Tomohiro Matsumoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 319 days.

(21) Appl. No.: 16/649,808

(22) PCT Filed: Aug. 24, 2018

(86) PCT No.: PCT/JP2018/031438
§ 371 (c)(1),
(2) Date: Mar. 23, 2020

(87) PCT Pub. No.: WO2019/073705
PCT Pub. Date: Apr. 18, 2019

(65) Prior Publication Data
US 2020/0314375 A1 Oct. 1, 2020

(30) Foreign Application Priority Data
Oct. 12, 2017 (JP) .............................. JP2017-198122

(51) Int. Cl.
*H04N 5/351* (2011.01)
*H04N 5/369* (2011.01)
(Continued)

(52) U.S. Cl.
CPC ............ *H04N 5/36961* (2018.08); *G01J 1/44* (2013.01); *H01L 27/14643* (2013.01); *H04N 5/351* (2013.01); *G01J 2001/4466* (2013.01)

(58) Field of Classification Search
CPC ...... H04N 5/351; H04N 5/3691; H04N 5/361; H04N 5/369; H04N 5/374; H04N 5/3745;
(Continued)

(56) References Cited

U.S. PATENT DOCUMENTS 10,785,423 B2 * 9/2020 Ikedo .................. H04N 5/37455
11,233,966 B1 * 1/2022 Niclass .................... G01T 1/248
(Continued)

FOREIGN PATENT DOCUMENTS

JP 53-013973 A 2/1978
JP 53-070480 A 6/1978
(Continued)

OTHER PUBLICATIONS

Larry Li, "Time-of-Flight Camera—An Introduction", Texas Instruments, Technical White Paper SLOA190B, pp. 1-10 Jan. 2014 Revised May 2014.
(Continued)

*Primary Examiner* — Marly S Camargo
(74) *Attorney, Agent, or Firm* — Michael Best & Friedrich LLP

(57) ABSTRACT

To control an excess bias to an appropriate value in a light detection device.
A solid-state image sensor includes a photodiode, a resistor, and a control circuit. In this solid-state image sensor, the photodiode photoelectrically converts incident light and outputs a photocurrent. Furthermore, in the solid-state image sensor, the resistor is connected to a cathode of the photodiode. Furthermore, in the solid-state image sensor, the control circuit supplies a lower potential to an anode of the
(Continued)

photodiode as a potential of the cathode of when the photocurrent flows through the resistor is higher.

21 Claims, 29 Drawing Sheets

(51) Int. Cl.
    *H04N 5/374*     (2011.01)
    *G01J 1/44*     (2006.01)
    *G01J 1/46*     (2006.01)
    *G01S 17/894*     (2020.01)
    *H01L 27/146*     (2006.01)

(58) Field of Classification Search
    CPC .......... H04N 5/36961; G01J 1/44; G01J 1/46; G01J 2001/442; G01S 17/894; G01S 7/486; H01L 27/14643; H01L 31/107
    See application file for complete search history.

(56) References Cited

U.S. PATENT DOCUMENTS

| | | | | |
|---|---|---|---|---|
| 11,290,675 | B2* | 3/2022 | Hirose | H04N 5/378 |
| 11,297,269 | B2* | 4/2022 | Yasuda | H04N 5/37455 |
| 2008/0231330 | A1* | 9/2008 | Deschamps | 250/214 R |
| 2012/0068050 | A1* | 2/2012 | Mazzillo | G01J 1/46 |
| 2016/0084964 | A1* | 3/2016 | Kimura | H01L 27/146 |
| 2016/0223397 | A1 | 8/2016 | Tsai et al. | |
| 2016/0273959 | A1 | 9/2016 | Wang | |
| 2017/0030769 | A1* | 2/2017 | Clemens | G01J 1/44 |
| 2017/0031010 | A1 | 2/2017 | Suzuki et al. | |
| 2017/0131143 | A1* | 5/2017 | Andreou | G01J 1/44 |
| 2018/0266881 | A1* | 9/2018 | Fujiwara | H01L 27/1443 |
| 2019/0189827 | A1* | 6/2019 | Haraguchi | H04N 5/3698 |
| 2021/0037203 | A1* | 2/2021 | Markawa | H01L 27/14621 |

FOREIGN PATENT DOCUMENTS

| | | |
|---|---|---|
| JP | 59-107650 A | 6/1984 |
| JP | 60-149929 A | 8/1985 |
| JP | 62-078886 A | 4/1987 |
| JP | 05-259777 A | 10/1993 |
| JP | 2013-016638 A | 1/2013 |
| JP | 2017-026615 A | 2/2017 |
| JP | 2017-033962 A | 2/2017 |

OTHER PUBLICATIONS

Extended European Search Report dated Oct. 13, 2020 for corresponding European Application No. 18866673.9.

* cited by examiner

SOLID-STATE IMAGE SENSOR AND ELECTRONIC DEVICE

TECHNICAL FIELD

The present technology relates to a solid-state image sensor and an electronic device. Specifically, the present technology relates to a solid-state image sensor that detects light using a photodiode and an electronic device.

BACKGROUND ART

Conventionally, a distance measuring method called a time of flight (ToF) method is known in electronic devices having a distance measuring function. This ToF method is a method of measuring a distance by irradiating an object with irradiation light from an electronic device, and obtaining a round-trip time until the irradiation light is reflected and returned to the electronic device. For example, a ToF-type camera that detects reflected light using a single-photon avalanche diode (SPAD) has been proposed (see, for example, Non-Patent Document 1). The SPAD is a photodiode in which sensitivity is improved by amplifying a photocurrent.

Here, the SPAD is used in Geiger mode of applying a reverse bias to a certain voltage or higher. In the Geiger mode, control to keep pull up to apply a constant potential with a power supply on an anode side and a resistance or a constant current on a cathode side is performed. Then, when light is detected, an anode-cathode voltage decreases to a breakdown voltage due to impact ionization, and the SPAD transitions from a high impedance state to a low impedance state. A solid-state image sensor can generate ToF data by detecting a change in cathode potential at that time. When the anode-cathode voltage decreases to the breakdown voltage, the SPAD becomes high impedance again, and when the SPAD becomes high impedance, the SPAD transitions to the Geiger mode again by pull up. In such a solid-state image sensor, a pixel characteristic is determined by an excess bias. Here, the excess bias is a value obtained by subtracting the breakdown voltage from the anode-cathode voltage in the Geiger mode.

CITATION LIST

Non-Patent Document

Non-Patent Document 1: Larry Li, "Time-of-Flight Camera—An Introduction", Texas Instruments, Technical White Paper SLOA190B January 2014 Revised May 2014

SUMMARY OF THE INVENTION

Problems to be Solved by the Invention

In the above-described conventional technology, a highly sensitive avalanche photodiode is used, and thus even weak reflected light can be detected. However, the excess bias may fluctuate due to a variation in the breakdown voltage and a temperature. As a result, the excess bias may become too small and the sensitivity of the photodiode may decrease, and conversely, the excess bias may become too large and dark current noise may increase. To suppress the fluctuation in the excess bias due to the variation in the breakdown voltage and the like, an operator may perform adjustment for each product but this increases labor. For this reason, in the above-described conventional technology, it is difficult to suppress the fluctuation in the excess bias due to the variation in the breakdown voltage and the like.

The present technology has been made in view of such a situation, and an object of the present technology is to control an excess bias to an appropriate value in a light detection device.

Solutions to Problems

The present technology has been made to solve the above-described problem, and the first aspect of the present technology is a solid-state image sensor including a photodiode configured to photoelectrically convert incident light and output a photocurrent, a resistor connected to a cathode of the photodiode, and a control circuit configured to supply a lower potential to an anode of the photodiode as a potential of the cathode of when the photocurrent flows through the resistor is higher. The above configuration exerts an effect of supplying a lower potential to the anode of the photodiode as the potential of the cathode of when the photocurrent flows through the resistor is higher, thereby controlling the excess bias to an appropriate value.

Furthermore, in the first aspect, a detection circuit configured to detect the potential of the cathode of when the photocurrent flows through the resistor and supply the detected potential to the control circuit can be further included. The above configuration exerts an effect of detecting the potential of the cathode of when the photocurrent flows.

Furthermore, in the first aspect, the resistor and the photodiode may be disposed in each of a plurality of pixel circuits, the respective cathodes of the plurality of pixel circuits may be commonly connected to the detection circuit, and the detection circuit may detect a minimum value of the respective potentials of the cathodes of when the photocurrent flows through the resistor. The above configuration exerts an effect of supplying a potential according to the minimum value of the respective potentials of the cathodes to the anode of the photodiode.

Furthermore, in the first aspect, a variable capacitor connected to the cathode can be further included. The above configuration exerts an effect of reducing an error of the cathode potential by the variable capacitor.

Furthermore, in the first aspect, a transistor configured to short-circuit both ends of the resistor according to a refresh pulse signal can be further included, and the control circuit can further supply the refresh pulse signal to the transistor immediately before incidence of the incident light. The above configuration exerts an effect of short-circuiting the both ends of the resistor by the refresh pulse signal immediately before the incidence of the incident light.

Furthermore, in the first aspect, the photodiode may be an avalanche photodiode, and the resistance value of the resistor may be a value at which the potential of the cathode is fixed. The above configuration exerts an effect of supplying a potential according to the fixed potential of the cathode to the anode of the photodiode.

Furthermore, in the first aspect, a comparator configured to compare the potential of the cathode with a predetermined potential and output a comparison result may be further included, and the control circuit may supply, to the anode, a lower potential than a potential of a case where the potential of the cathode is less than the predetermined potential, in a case where the potential of the cathode is higher than the predetermined potential, on the basis of the comparison result. The above configuration exerts an effect of supplying a potential according to the comparison result between the potential of the cathode and the predetermined potential to the anode of the photodiode.

Furthermore, in the first aspect, the control circuit may count a number of times of when the potential of the cathode becomes lower than a predetermined threshold value in a predetermined period, and may supply, to the anode, a lower potential than a potential of a case where the number of times is larger than a predetermined number of times, in a case where the number of times is less than the predetermined number of times. The above configuration exerts an effect of supplying a potential according to the number of times of when the potential of the cathode becomes lower than the predetermined threshold value to the anode of the photodiode.

Furthermore, in the first aspect, an inverter configured to invert a signal of the potential of the cathode and output the signal as a pulse signal may be further included, and the control circuit may supply a lower potential to the anode of the photodiode as a pulse width of the pulse signal is shorter. The above configuration exerts an effect of supplying a potential according to the pulse width of the pulse signal to the anode of the photodiode.

Furthermore, in the first aspect, one end of the resistor can be connected to the cathode and the other end of the resistor is connected to a terminal of a predetermined potential, and the control circuit can measure a voltage between the potential of the cathode and the predetermined potential, and can supply a lower potential to the anode of the photodiode as the voltage is higher. The above configuration exerts an effect of supplying a potential according to the voltage between the potential of the cathode and the predetermined potential to the anode of the photodiode.

Furthermore, in the first aspect, the resistor and the photodiode can be disposed in each of a plurality of pixel circuits, and the control circuit can set any one of the plurality of pixel circuits to be enabled and measures the voltage between the potential of the cathode of the set pixel circuit and the predetermined potential. The above configuration exerts an effect of supplying a potential according to the potential of the cathode of the pixel circuit set to be enabled to the anode of the photodiode.

Furthermore, the second aspect of the present technology is a solid-state image sensor including a photodiode configured to photoelectrically convert incident light and output a photocurrent, a resistor connected to a cathode of the photodiode, and a control circuit configured to measure a temperature and supply a lower potential to an anode of the photodiode as the temperature is lower. The above configuration exerts an effect of supplying a lower potential to the anode of the photodiode as the temperature is lower.

Furthermore, the third aspect of the present technology is an electronic device including a light emitting unit configured to supply irradiation light, a photodiode configured to photoelectrically convert reflected light with respect to the irradiation light and output a photocurrent, a resistor connected to a cathode of the photodiode, and a control circuit configured to supply a lower potential to an anode of the photodiode as a potential of the cathode of when the photocurrent flows through the resistor is higher. The above configuration exerts an effect of supplying a lower potential to the anode of the photodiode as the potential of the cathode of when the photocurrent obtained by photoelectrically converting the reflected light flows through the resistor is higher.

Effects of the Invention

According to the present technology, an excellent effect of suppressing a fluctuation from an appropriate value of an anode potential of a photodiode can be exerted in a light detection device. Note that effects described here are not necessarily limited, and any of effects described in the present disclosure may be exhibited.

MODE FOR CARRYING OUT THE INVENTION

Hereinafter, modes for implementing the present technology (hereinafter referred to as embodiments) will be described. Description will be given according to the following order.

1. First Embodiment (an example of controlling an anode potential according to a cathode potential)
2. Second Embodiment (an example of controlling an anode potential according to a minimum value of cathode potentials of a plurality of monitor pixels)
3. Third Embodiment (an example of controlling an anode potential according to a fixed cathode potential output by a monitor pixel)
4. Fourth Embodiment (an example of controlling an anode potential according to a comparison result of a cathode potential and a predetermined potential)
5. Fifth Embodiment (an example of controlling an anode potential according to a count value related to a cathode potential)
6. Sixth Embodiment (an example of controlling an anode potential according to a pulse width related to a cathode potential)
7. Seventh Embodiment (an example of controlling an anode potential according to an excess bias related to a cathode potential)
8. Eighth Embodiment (an example of controlling an anode potential according to a cathode potential of an enabled monitor pixel)
9. Ninth Embodiment (an example of controlling an anode potential according to a cathode potential of a monitor pixel to which a variable capacitor is added)
10. Tenth Embodiment (an example of controlling an anode potential according to a cathode potential of a monitor pixel to which a pulse signal is supplied)
11. Eleventh Embodiment (an example of controlling an anode potential according to temperature)
12. Application to Moving Body 1. First Embodiment

[Configuration Example of Distance Measuring Module]

Figure 1:
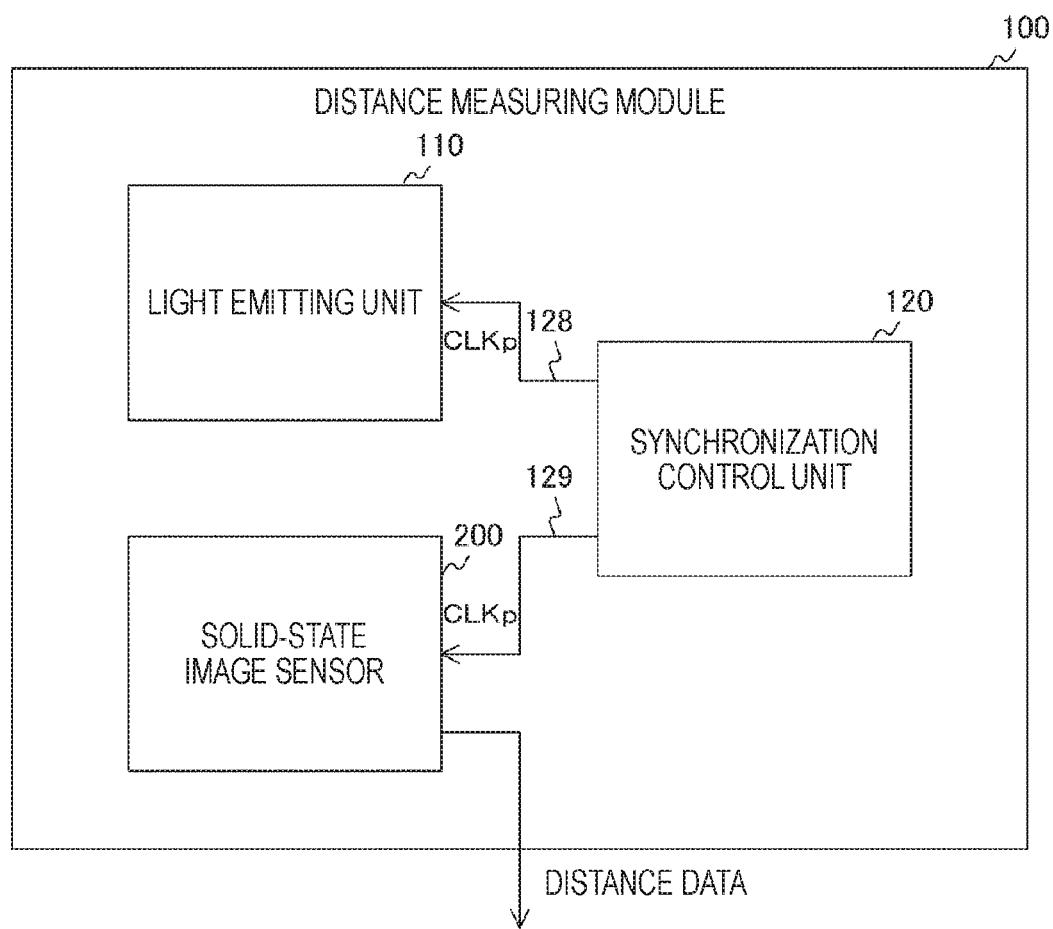
FIG. 1 is a block diagram illustrating a configuration example of a distance measuring module according to a first embodiment of the present technology.

FIG. 1 is a block diagram illustrating a configuration example of a distance measuring module 100 according to the first embodiment of the present technology. The distance measuring module 100 measures a distance to an object, and includes a light emitting unit 110, a synchronization control unit 120, and a solid-state image sensor 200. The distance measuring module 100 is mounted on a smartphone, a personal computer, an in-vehicle device, or the like, and is used for measuring a distance.

The synchronization control unit 120 operates the light emitting unit 110 and the solid-state image sensor 200 in synchronization with each other. The synchronization control unit 120 supplies a clock signal having a predetermined frequency (such as 10 to 20 megahertz) as a light emission control signal CLKp to the light emitting unit 110 and the solid-state image sensor 200 via signal lines 128 and 129.

The light emitting unit 110 supplies intermittent light as irradiation light in synchronization with the light emission control signal CLKp from the synchronization control unit 120. For example, near infrared light or the like is used as the irradiation light.

The solid-state image sensor 200 receives reflected light with respect to the irradiation light, and measures a round-trip time from light emission timing indicated by the light emission control signal CLKp to timing at which the reflected light is received. The solid-state image sensor 200 calculates the distance to an object from the round-trip time, and generates and outputs distance data indicating the distance.

[Configuration Example of Solid-State Image Sensor]

Figure 2:
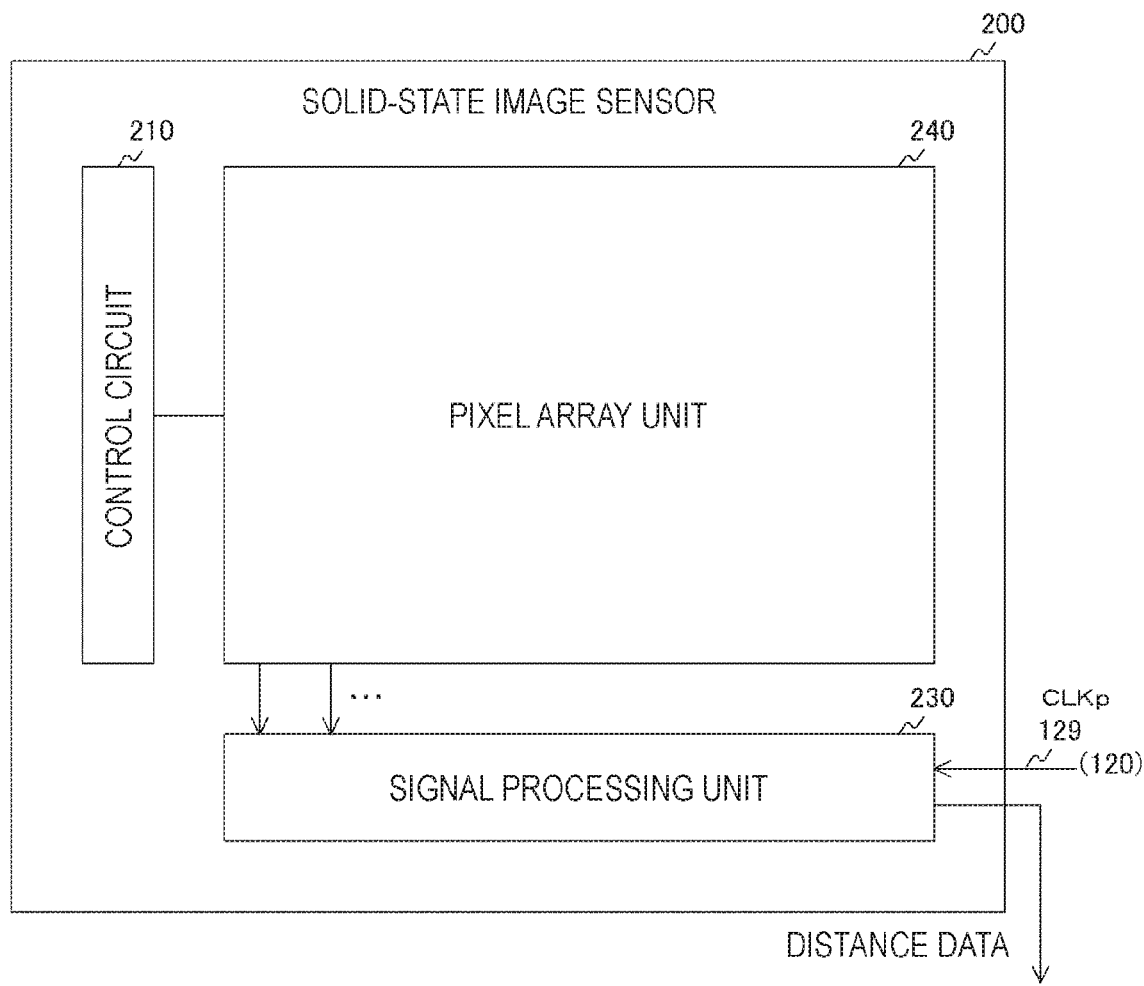
FIG. 2 is a block diagram illustrating a configuration example of a solid-state image sensor according to the first embodiment of the present technology.

FIG. 2 is a block diagram illustrating a configuration example of the solid-state image sensor 200 according to the first embodiment of the present technology. The solid-state image sensor 200 includes a control circuit 210, a pixel array unit 240, and a signal processing unit 230. In the pixel array unit 240, a plurality of pixel circuits is arrayed in a two-dimensional lattice manner.

The control circuit 210 controls each potential of the pixel circuit in the pixel array unit 240. Details of control content will be described below.

The signal processing unit 230 measures the round-trip time for each pixel circuit on the basis of a signal from the pixel circuit and the light emission control signal CLKp from the synchronization control unit 120, and calculates the distance. The signal processing unit 230 generates distance data indicating the distance for each pixel circuit and outputs the distance data to the outside.

Figure 3:
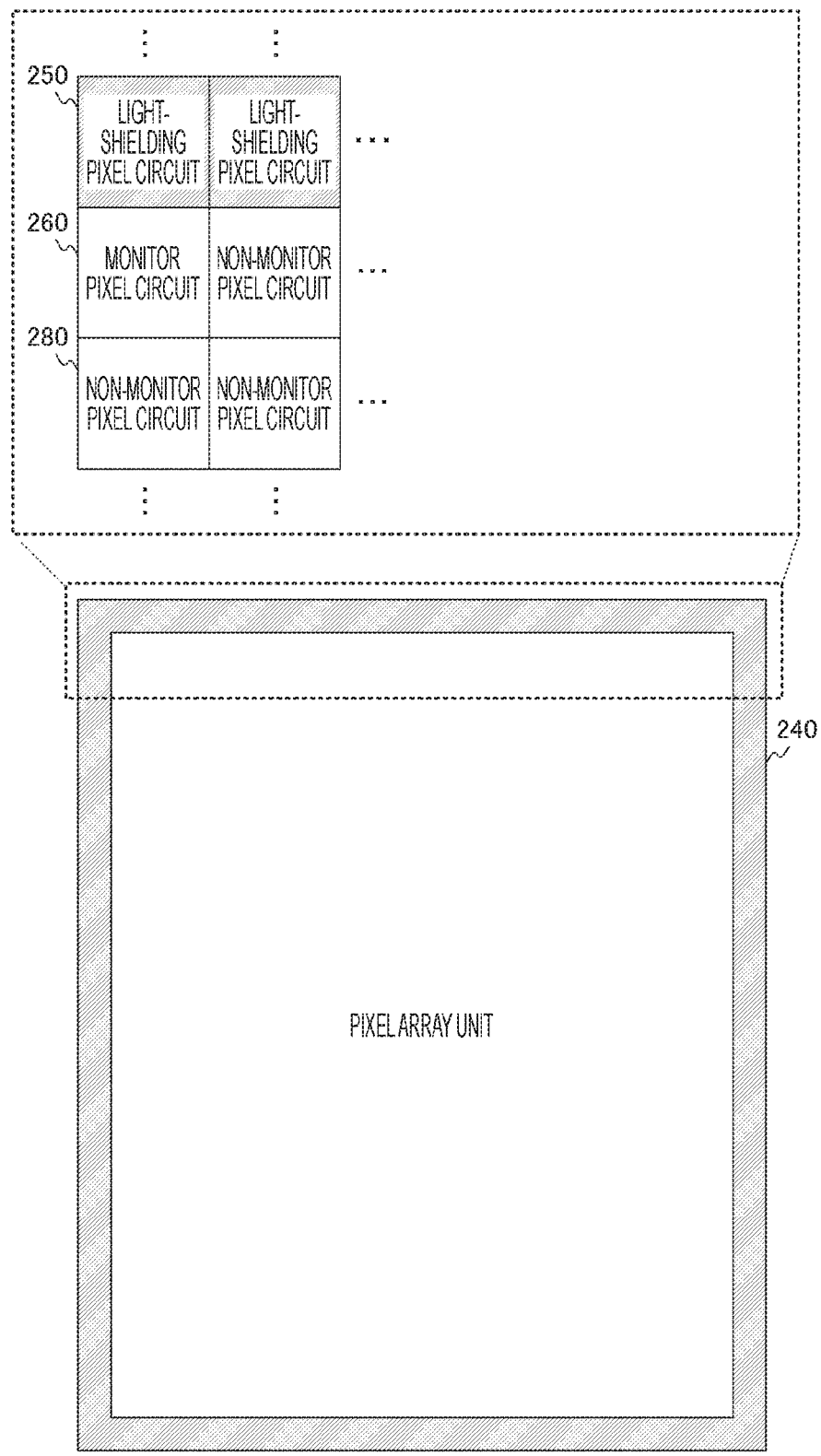
FIG. 3 is an example of a plan view of a pixel array unit according to the first embodiment of the present technology.

FIG. 3 is an example of a plan view of the pixel array unit 240 according to the first embodiment of the present technology. A part of the pixel array unit 240 is shielded from light, light-shielding pixel circuits 250 are arrayed in the shielded part, and a monitor pixel circuit 260 and non-monitor pixel circuits 280 are arrayed in a part that is not shielded from light. In FIG. 3, the shaded part is a part of the pixel array unit 240 where the light-shielding pixel circuits 250 are arrayed. Furthermore, the total number of the monitor pixel circuit 260 and the non-monitor pixel circuits 280 is N (N is an integer of 2 or more), and the monitor pixel circuit 260 and the non-monitor pixel circuits 280 are arrayed in a two-dimensional lattice manner. Furthermore, one of the N circuits is the monitor pixel circuit 260, and the remaining is the non-monitor pixel circuits 280.

Hereinafter, a set of the pixel circuits arrayed in a horizontal direction is referred to as a "row", and a set of the pixel circuits arrayed in a direction perpendicular to the row is referred to as a "column".

[Configuration Example of Pixel Circuit]

Figure 4:
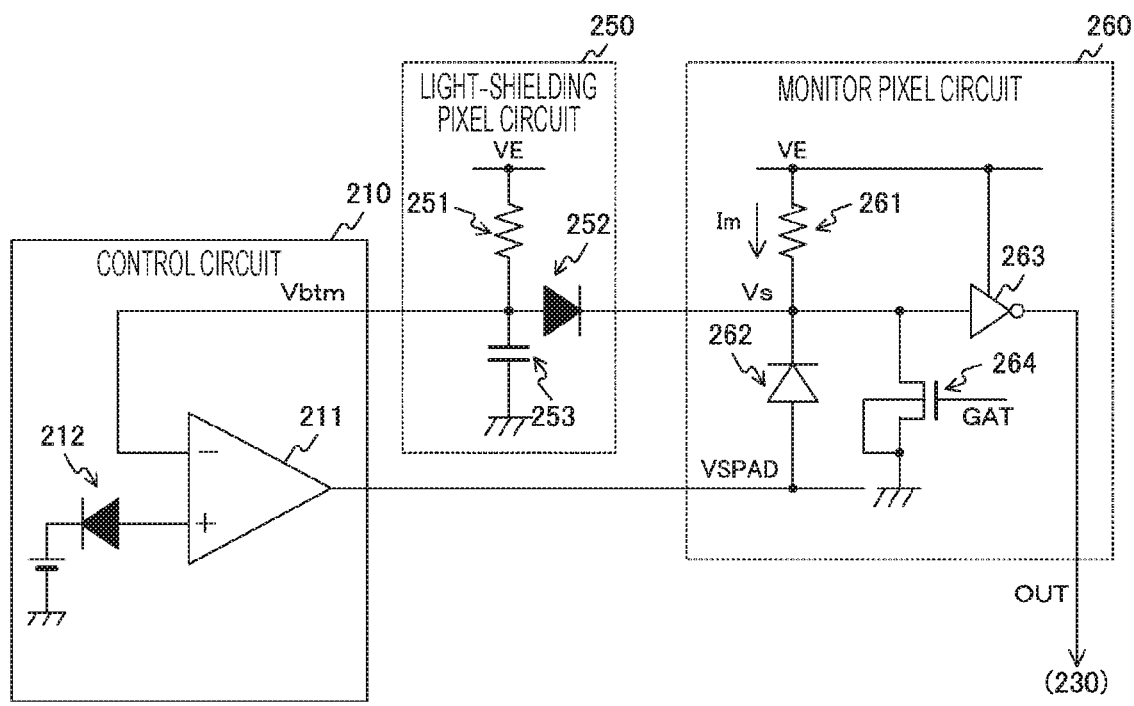
FIG. 4 is an example of a circuit diagram of a control circuit, a light-shielding pixel circuit, and a monitor pixel circuit according to the first embodiment of the present technology.

FIG. 4 is an example of a circuit diagram of the control circuit 210, the light-shielding pixel circuit 250, and the monitor pixel circuit 260 according to the first embodiment of the present technology.

The monitor pixel circuit 260 includes a resistor 261, a photodiode 262, an inverter 263, and a transistor 264.

One end of the resistor 261 is connected to a cathode of the photodiode 262, and the other end of the resistor 261 is connected to a terminal of a potential VE. As the transistor 264, for example, an N-type metal oxide semiconductor (MOS) transistor is used. A gate signal GAT having a predetermined potential is applied to a gate of the transistor 264, a source of the transistor 264 is connected to a back gate and a ground terminal, and a drain of the transistor 264 is connected to the cathode of the photodiode 262 and an input terminal of the inverter 263. For example, a low level is set to the gate signal GAT in a row reading period.

When reflected fight enters the photodiode 262, the photodiode 262 photoelectrically converts the incident light and outputs a photocurrent Im. As the photodiode 262, an SPAD is used, for example. SPAD furthermore, an anode potential VSPAD of the photodiode 262 is controlled by the control circuit 210.

The inverter 263 inverts a signal of a cathode potential Vs of the photodiode 262 and outputs the inverted signal to the signal processing unit 230 as a pulse signal OUT. The inverter 263 outputs a low-level pulse signal OUT in a case where the cathode potential Vs is higher than a predetermined threshold value, and outputs a high-level pulse signal OUT in a case where the cathode potential Vs is equal to or lower than the threshold value.

At the incidence of the reflected light, the photocurrent Im from the photodiode 262 flows through the resistor 261, and the cathode potential Vs drops according to a current value of the photocurrent Im. When the cathode potential Vs at the time of the drop is equal to or lower than the threshold value, the inverter 263 outputs the high-level pulse signal OUT. Therefore, the signal processing unit 230 can detect rising timing of the pulse signal OUT as light receiving timing. Furthermore, the cathode potential Vs of the monitor pixel circuit 260 is monitored by the light-shielding pixel circuit 250.

Furthermore, the light-shielding pixel circuit 250 includes a resistor 251, a diode 252, and a capacitor 253. The resistor 251 and the capacitor 253 are connected in series between the terminal of the potential VE and the ground terminal. Furthermore, a cathode of the diode 252 is connected to the cathode of the photodiode 262, and an anode of the diode 252 is connected to a connection point of the resistor 251 and the capacitor 253.

With the above configuration, the light-shielding pixel circuit 250 detects the potential of the cathode at the incidence of the incident light as a bottom potential Vbtm. Note that the light-shielding pixel circuit 250 is an example of a detection circuit described in the claims.

Furthermore, the control circuit 210 includes a comparator 211 and a correction diode 212. An inverting input terminal (−) of the comparator 211 is connected to the connection point of the resistor 251 and the capacitor 253, and a non-inverting input terminal (+) of the comparator 211 is connected to an anode of the correction diode 212. A predetermined power supply is connected to a cathode of the correction diode 212. Temperature characteristics of the correction diode 212 are the same as those of the diode 252. An error of a bottom potential Vtm due to the temperature characteristics of the diode 252 can be corrected by insertion of the correction diode 212.

The comparator 211 generates a lower potential as VSPAD as the bottom potential Vbtm is higher and supplies VSPAD to the anode of the photodiode 262 according to the following expression.

$$VSPAD = Av(VDD - Vbtm)$$

In the above expression, Av represents a gain of the comparator 211, and VDD represents a power supply potential.

Figure 5:
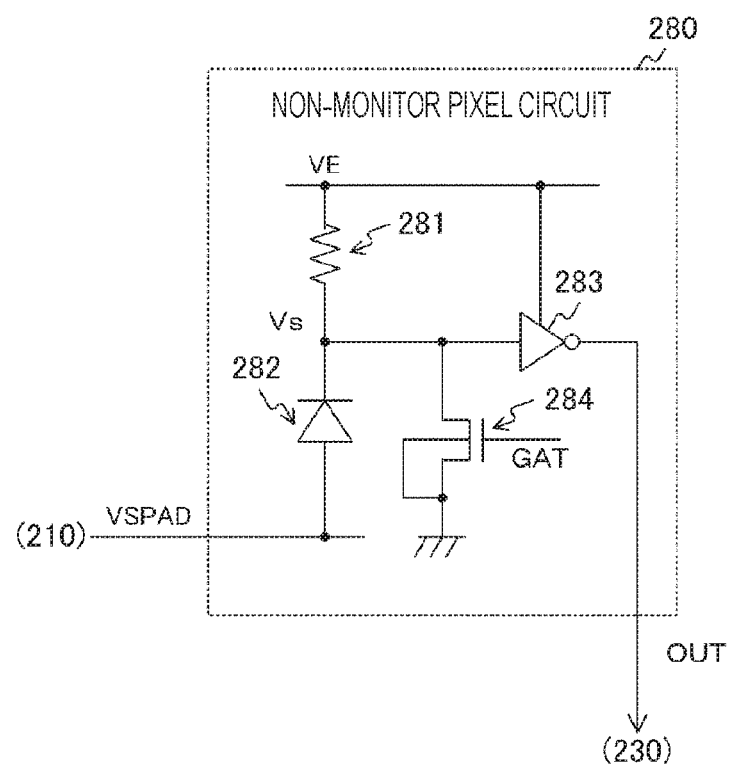
FIG. 5 is an example of a circuit diagram of a non-monitor pixel circuit according to the first embodiment of the present technology.

FIG. 5 is an example of a circuit diagram of the non-monitor pixel circuit 280 according to the first embodiment of the present technology. The non-monitor pixel circuit 280 includes a resistor 281, a photodiode 282, an inverter 283, and a transistor 284. Connection configurations of these elements are similar to those of the monitor pixel circuit 260. However, in the non-monitor pixel circuit 280, a cathode of the photodiode 282 is not connected to the light-shielding pixel circuit 250, and a potential of the cathode is not monitored.

Figure 6:
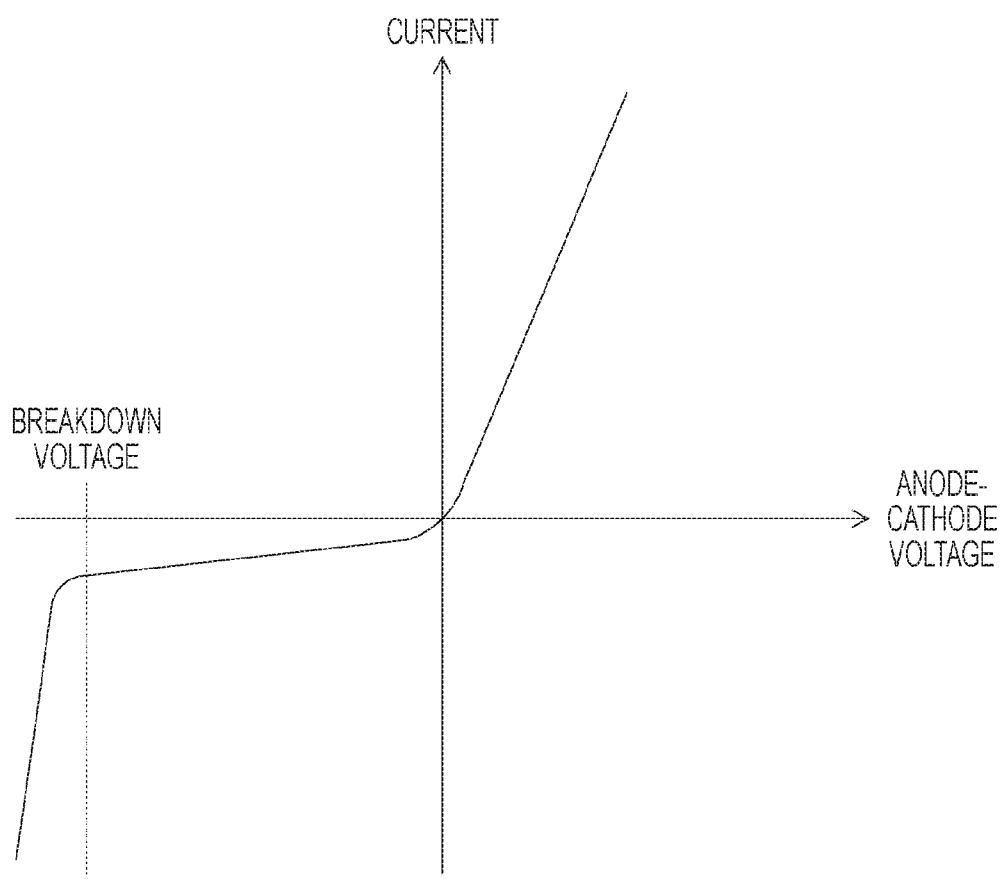
FIG. 6 is a graph illustrating an example of a voltage-current characteristic of a photodiode according to the first embodiment of the present technology.

FIG. 6 is a graph illustrating an example of a voltage-current characteristic of the photodiode 262 according to the first embodiment of the present technology. The horizontal axis in FIG. 6 represents the voltage applied between the anode and the cathode of the photodiode 262, and the vertical axis in FIG. 6 represents the photocurrent from the photodiode 262. In a case of operating the photodiode 262 in the Geiger mode, a negative value, that is, a reverse bias is applied to the anode-cathode voltage of the photodiode 262. In a case of using the above-described SPAD as the photodiode 262, if the reverse bias is lower than a predetermined breakdown voltage, an avalanche breakdown occurs in the photodiode 262, and the photocurrent is amplified. When a voltage that is lower by several volts than the breakdown voltage is applied between the anode and the cathode, the gain in amplification becomes substantially infinite, and one photon becomes able to be detected.

[Configuration Example of Signal Processing Unit]

Figure 7:
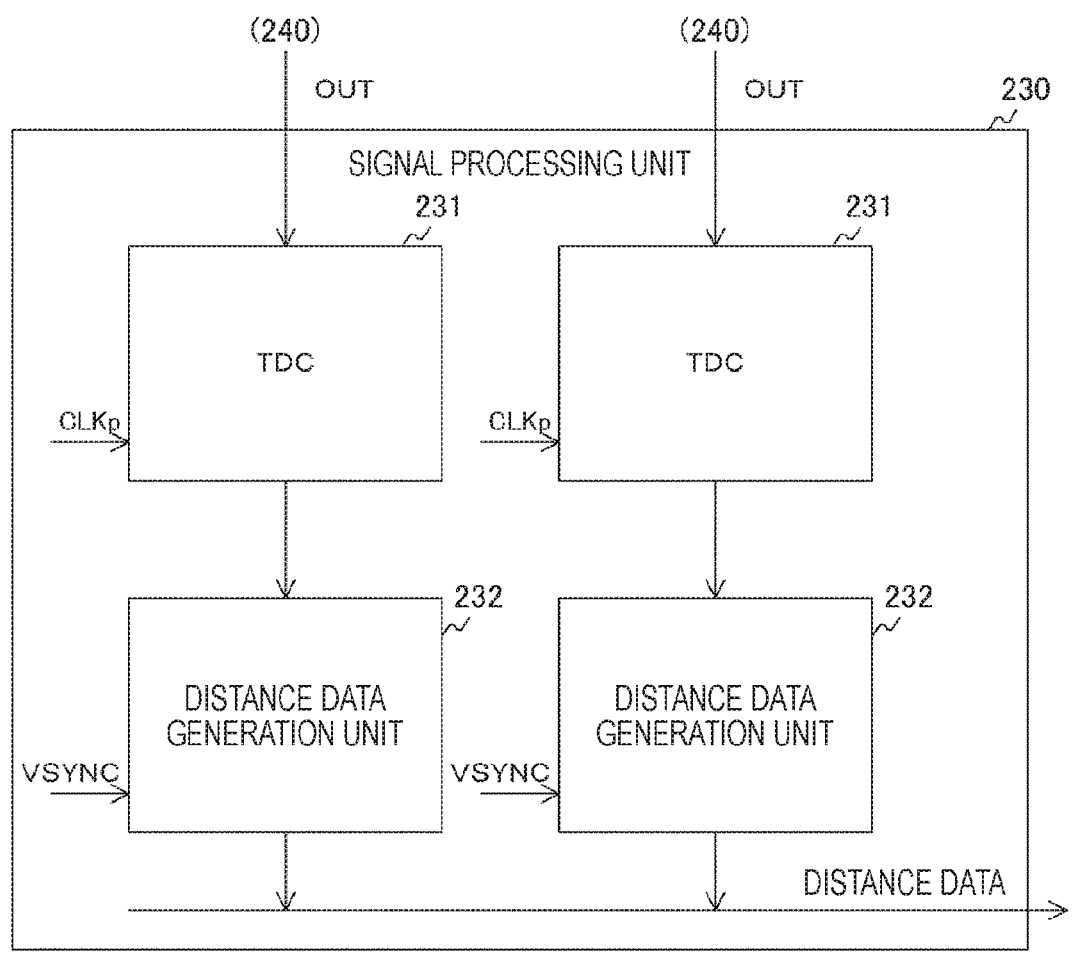
FIG. 7 is a block diagram illustrating a configuration example of a signal processing unit according to the first embodiment of the present technology.

FIG. 7 is a block diagram illustrating a configuration example of the signal processing unit 230 according to the first embodiment of the present technology. The signal processing unit 230 includes a time-to-digital converter (TDC) 231 and a distance data generation unit 232 for each column.

The TDC 231 measures the time from the light emission timing indicated by the light emission control signal CLKp to the rising of the pulse signal OUT from a corresponding column (that is, the light receiving timing). The TDC 231 supplies a digital signal indicating the measured time to the distance data generation unit 232.

The distance data generation unit 232 calculates a distance D to an object. The distance data generation unit 232 calculates, as a round trip time dt, a mode value of times measured by the TDC 231 within each period of a vertical synchronization signal VSYNC having a frequency (such as 30 Hz) lower than the light emission control signal CLKp. Then, the distance data generation unit 232 calculates the distance D using the following expression, and outputs distance data indicating the distance D.

$$D = c \times dt/2$$

In the above expression, c is light speed, and the unit is meter per second (m/s). Furthermore, the unit of the distance D is, for example, meter (m), and the unit of the round-trip time dt is, for example, second (s).

Figure 8:
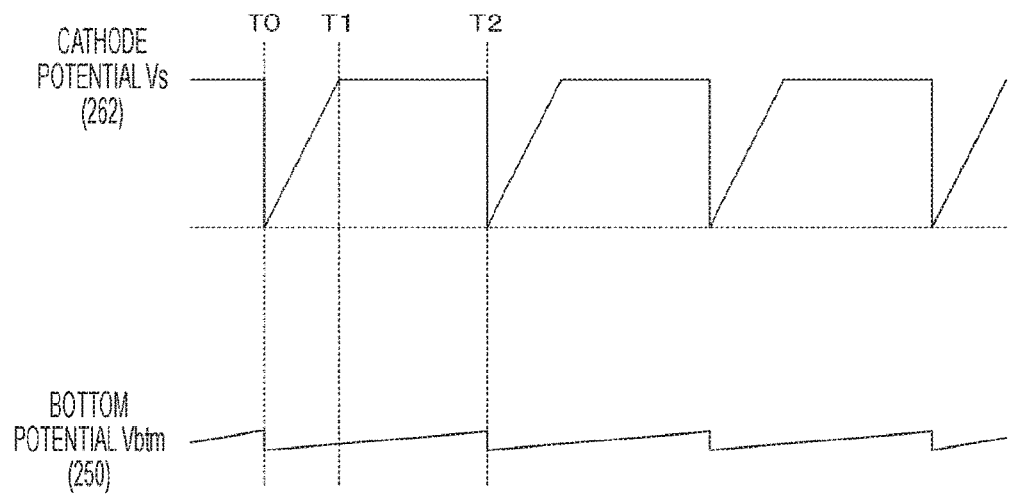
FIG. 8 is a timing chart illustrating an example of fluctuations in a cathode potential and a bottom potential according to the first embodiment of the present technology.

FIG. 8 is a timing chart illustrating an example of fluctuations in the cathode potential Vs and the bottom potential Vbtm according to the first embodiment of the present technology.

When the reflected light is incident at certain timing T0, the photocurrent from the photodiode 262 flows through the resistor 261, causing a voltage drop, and the cathode potential Vs decreases. The light-shielding pixel circuit 250 outputs the potential at this time to the control circuit 210 as the bottom potential Vbtm.

Then, when a certain recharge time elapses from the timing T0, the cathode potential Vs returns to the potential before the decrease. When the reflected light is incident at subsequent timing T2, the cathode potential Vs decreases again. Thereafter, a similar operation is repeated.

Furthermore, the bottom potential Vbtm slightly increases between the timing T0 and the timing T2 according to the capacitance of the capacitor 253. Here, assuming that an actual minimum value of the cathode potential Vs is a true value, the bottom potential Vbtm has a slight error with respect to the true value, but a value close to the true value can be output by sufficiently increasing the capacitance of the capacitor 253.

Figure 9:
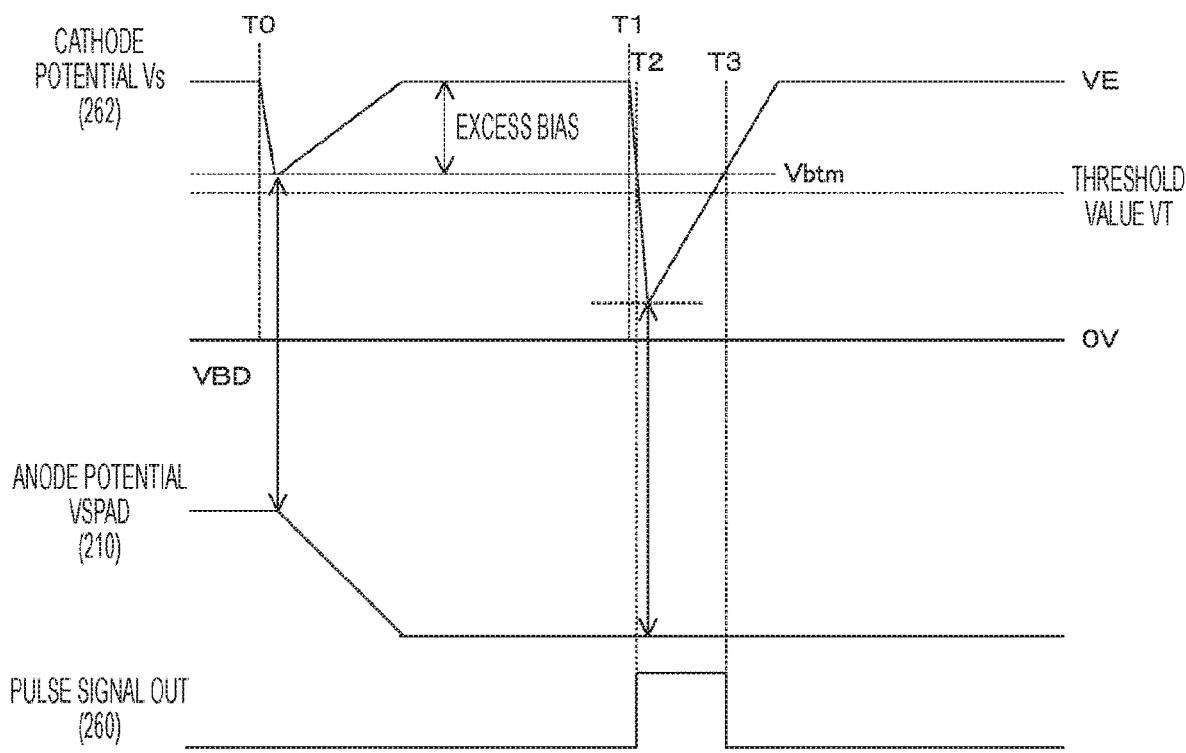
FIG. 9 is a timing chart illustrating an example of fluctuations in a cathode potential, an anode potential, and a pulse signal of when the bottom potential is high according to the first embodiment of the present technology.

FIG. 9 is a timing chart illustrating an example of fluctuations in the cathode potential, the anode potential, and the pulse signal of when the bottom potential is high according to the first embodiment of the present technology. When the reflected light is incident at certain timing T0, the cathode potential Vs drops to the bottom potential Vbtm higher than a threshold value VT, and returns to the original potential VE by recharging. Here, the threshold value VT is a voltage for determining whether or not the incident light has been incident. When the cathode potential Vs is lower than the threshold value VT, the inverter 263 outputs the high-level pulse signal OUT.

Then, assuming that a voltage (breakdown voltage) of a difference between the bottom potential Vbtm and the anode potential VSPAD is VBD, the excess bias fluctuates depending on the variation in the breakdown voltage VBD and the temperature. The excess bias becomes larger as the breakdown voltage VBD is higher. Usually, the excess bias is a value at which the bottom potential Vbtm becomes smaller than the threshold value VT.

However, there are some cases where the excess bias fluctuates due to the variation in the voltage VBD and the temperature, and the bottom potential Vbtm does not become lower than the threshold value VT. In this case, the pulse signal OUT does not become a high level although the light is incident, and the subsequent signal processing unit 230 may become unable to detect the incident light. Therefore, if the anode potential is set to a fixed value, the photon detection efficiency (PDE) may decrease. Here, the photon detection efficiency indicates a ratio of a counted number of photons to the number of incident photons when light is incident and photon counting is performed. The sensitivity of the photodiode 262 becomes higher as the photon detection efficiency is higher.

Therefore, the control circuit 210 lowers the anode potential VSPAD as the bottom potential Vbtm is higher. Thereby, the voltage VBD becomes high, the photocurrent increases, and the excess bias becomes large. Therefore, when light is incident again at the timing T1, the cathode potential Vs becomes lower than the threshold value VT at the timing T2. Then, when the cathode potential Vs reaches the bottom potential, the cathode potential Vs rises by recharging and becomes equal to or higher than the threshold value VT at timing T3. Furthermore, the inverter 263 outputs the high-level pulse signal OUT between the timing T2 and the timing T3. As described above, by controlling the anode potential VSPAD to be high, the pulse signal OUT rises at the incidence of light. Therefore, the signal processing unit 230 can detect the light and the photon detection efficiency (PDF) is sufficiently high.

Figure 10:
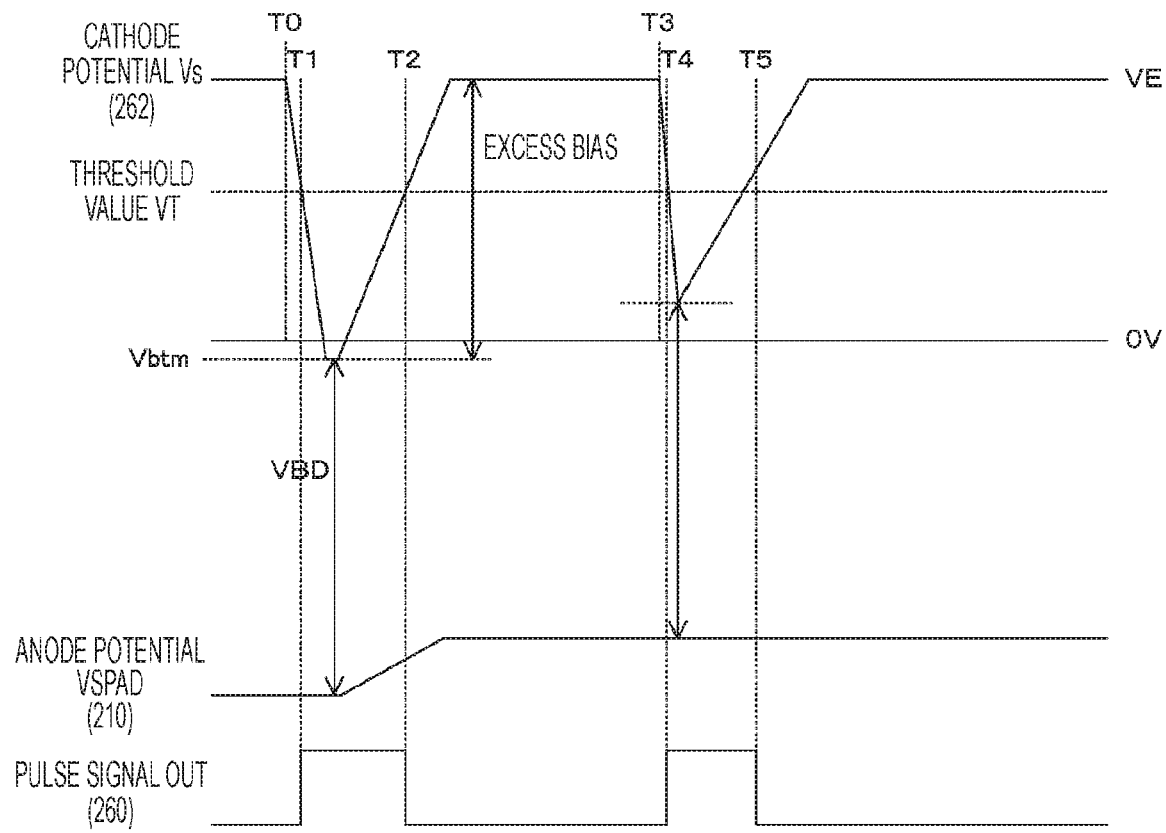
FIG. 10 is a timing chart illustrating an example of fluctuations in the cathode potential, the anode potential, and the pulse signal of when the bottom potential is low according to the first embodiment of the present technology.

FIG. 10 is a timing chart illustrating an example of fluctuations in the cathode potential, the anode potential, and the pulse signal of when the bottom potential is low according to the first embodiment of the present technology. When the reflected light is incident at certain timing T0, the cathode potential Vs drops and becomes lower than the threshold value VT at the timing T1. Then, the cathode potential Vs drops to the bottom potential Vbtm lower than 0 volts, and thereafter rises by recharging and becomes higher than the threshold value VT at the timing T2. Furthermore, the inverter 263 outputs the high-level pulse signal OUT between the timing T1 and the timing T2.

When the voltage VBD is sufficiently high, the bottom potential Vbtm becomes lower than the threshold value VT, so that the incident light can be detected as described above. However, if the voltage VBD becomes too high due to factors such as temperature, detection of incident light becomes susceptible to dark current noise. As a result, the anode potential is set to a fixed value, a dark count rate (DCR) indicating an erroneous count rate due to dark current noise may increase. Furthermore, there is a possibility of occurrence of latch-up and a high probability of failure of the photodiode 262.

Therefore, the control circuit 210 increases the anode potential VSPAD as the bottom potential Vbtm is lower. Thereby, the voltage VBD becomes low, the excess bias becomes small, and the bottom potential Vbtm becomes high. As a result, adverse effects such as an increase in the erroneous count rate (DCR) are suppressed.

However, the bottom potential Vbtm is controlled to be lower than the threshold value VT. Therefore, when light is incident again at the timing T3, the cathode potential Vs becomes lower than the threshold value VT at timing T4. Then, when the cathode potential Vs reaches the bottom potential, the cathode potential Vs rises by recharging and becomes equal to or higher than the threshold value VT at timing T5. Furthermore, the inverter 263 outputs the high-level pulse signal OUT between the timing T4 and the timing T5. Therefore, the photon detection efficiency is maintained at a sufficiently high value.

Figure 11:
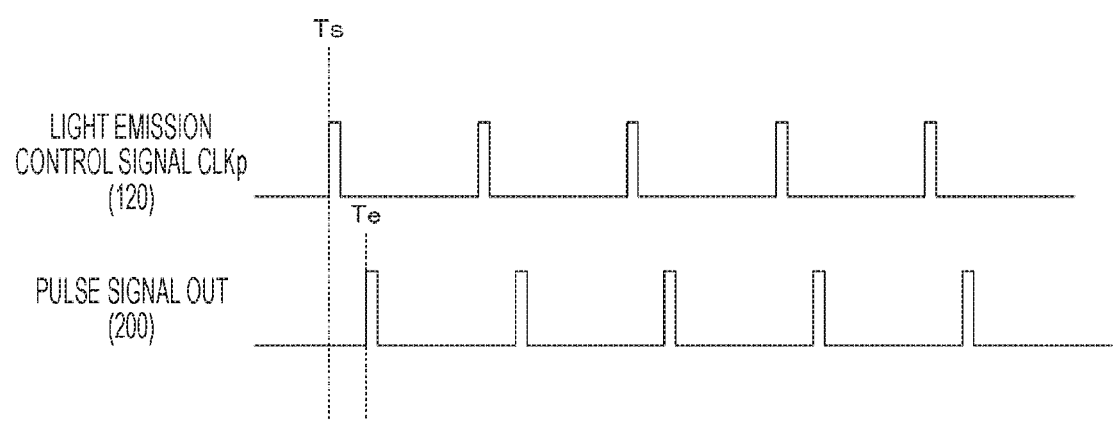
FIG. 11 is a timing chart illustrating an example of fluctuations in a light emission control signal and the pulse signal according to the first embodiment of the present technology.

FIG. 11 is a timing chart illustrating an example of fluctuations in a light emission control signal and the pulse signal according to the first embodiment of the present technology. The light emitting unit 110 emits light in synchronization with the light emission control signal CLKp, and the solid-state image sensor 200 receives the reflected light and generates the pulse signal OUT. The time from rising timing Ts of the light emission control signal CLKp to rising timing Te of the pulse signal is a value according to the distance. The solid-state image sensor 200 calculates the distance D to an object from statistical amounts (a mode value and the like) of the time.

[Operation Example of Distance Measuring Module]

Figure 12:
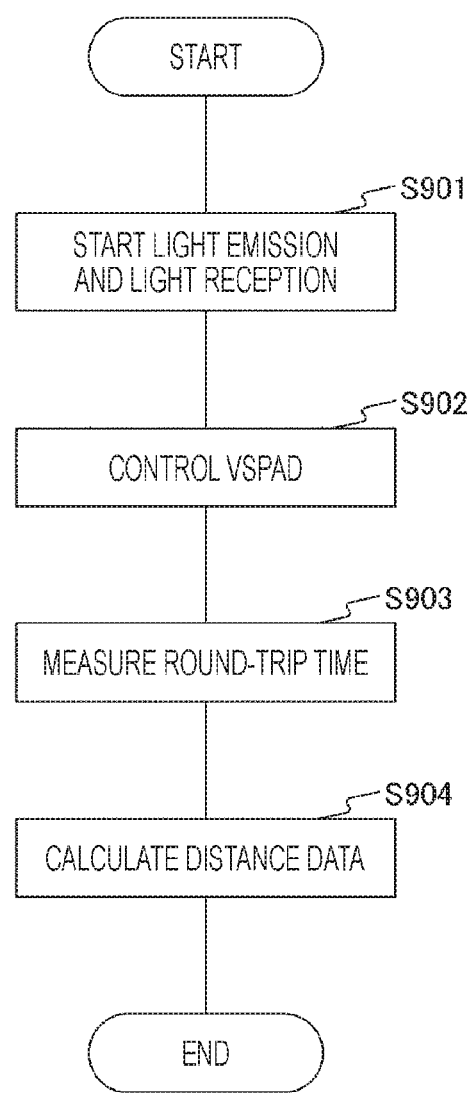
FIG. 12 is a flowchart illustrating an example of an operation of the distance measuring module according to the first embodiment of the present technology.

FIG. 12 a flowchart illustrating an example of an operation of the distance measuring module 100 according to the first embodiment of the present technology. This operation is started when, for example, a predetermined application for measuring the distance is executed.

The light emitting unit 110 starts light emission, and the pixel circuit in the solid-state image sensor 200 starts to receive the reflected light (step S901). Furthermore, the control circuit 210 controls the anode potential VSPAD according to the bottom potential Vbtm (step S902). Furthermore, the signal processing unit 230 measures the round-trip time (step S903), and calculates the distance data from the round-trip time (step S904). After step S904, the solid-state image sensor 200 terminates the operation for distance measurement. In a case of performing distance measurement a plurality of times, steps S901 to S904 are repeatedly executed in synchronization with the vertical synchronization signal VSYNC.

As described above, in the first embodiment of the present technology, the solid-state image sensor 200 supplies the lower anode potential VSPAD as the bottom potential Vbtm is higher, thereby increasing the photocurrent from the photodiode 262 as the bottom potential Vbtm is higher. Thereby, the fluctuation in the excess bias due to the variation in the breakdown voltage (VBD) and the temperature can be suppressed.

2. Second Embodiment

In the above-described first embodiment, the solid-state image sensor 200 has only one monitor pixel circuit 260 disposed in the pixel array unit 240, but there is a possibility of a failure of the monitor pixel circuit 260 due to, for example, deterioration over time, and the pixel becomes a defective pixel. A pixel array unit 240 of a second embodiment is different from that of the first embodiment in arranging a plurality of monitor pixel circuits 260.

Figure 13:
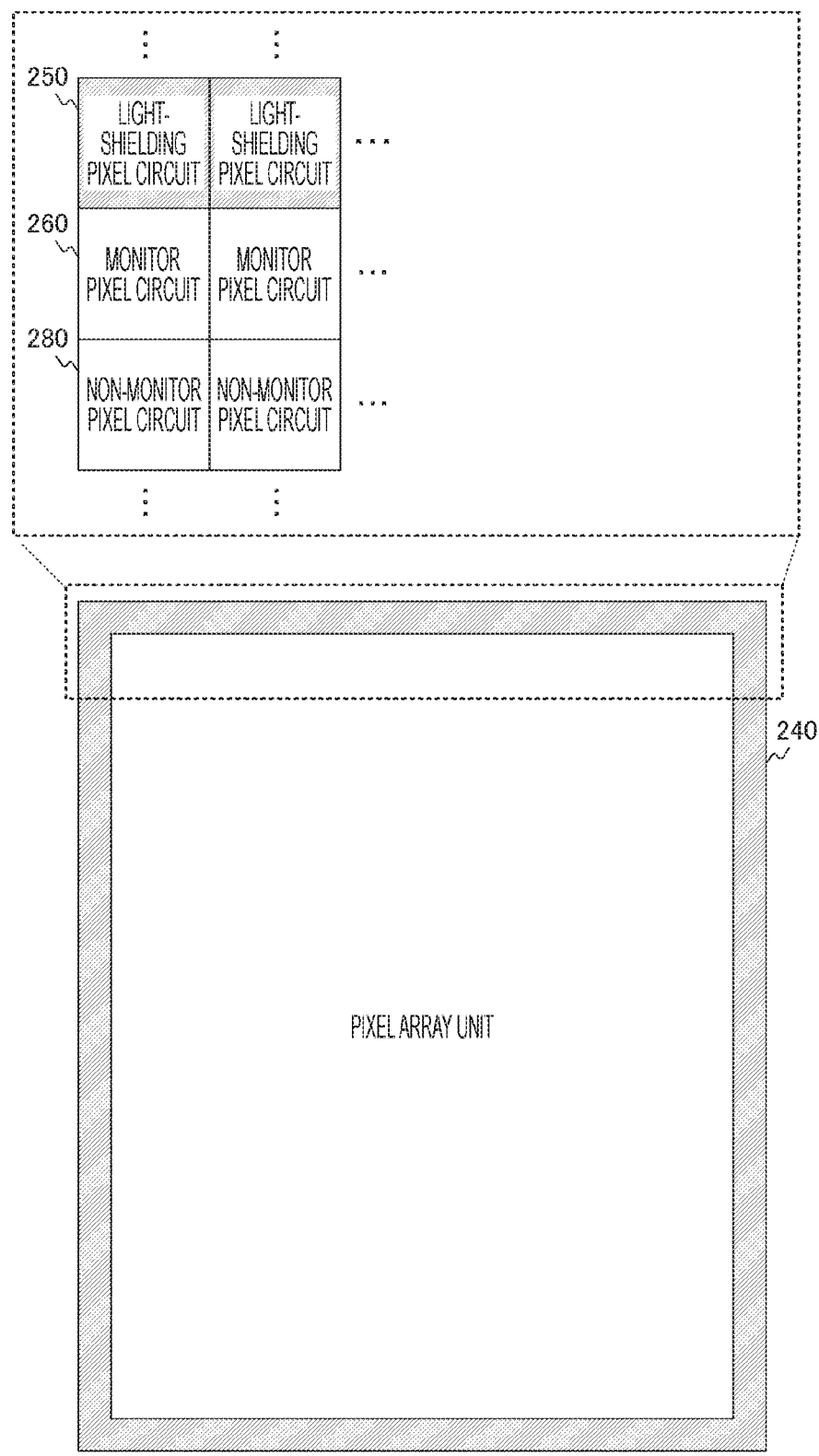
FIG. 13 is an example of a plan view of a pixel array unit according to a second embodiment of the present technology.

FIG. 13 is an example of a plan view of the pixel array unit 240 according to the second embodiment of the present technology. The pixel array unit 240 is different from that of the first embodiment in arranging two or more monitor pixel circuits 260.

For example, one row of the pixel array unit 240 includes M (M is an integer from 2 to N, exclusive of N) monitor pixel circuits 260, and non-monitor pixel circuits 280 are arrayed in the remaining rows.

Figure 14:
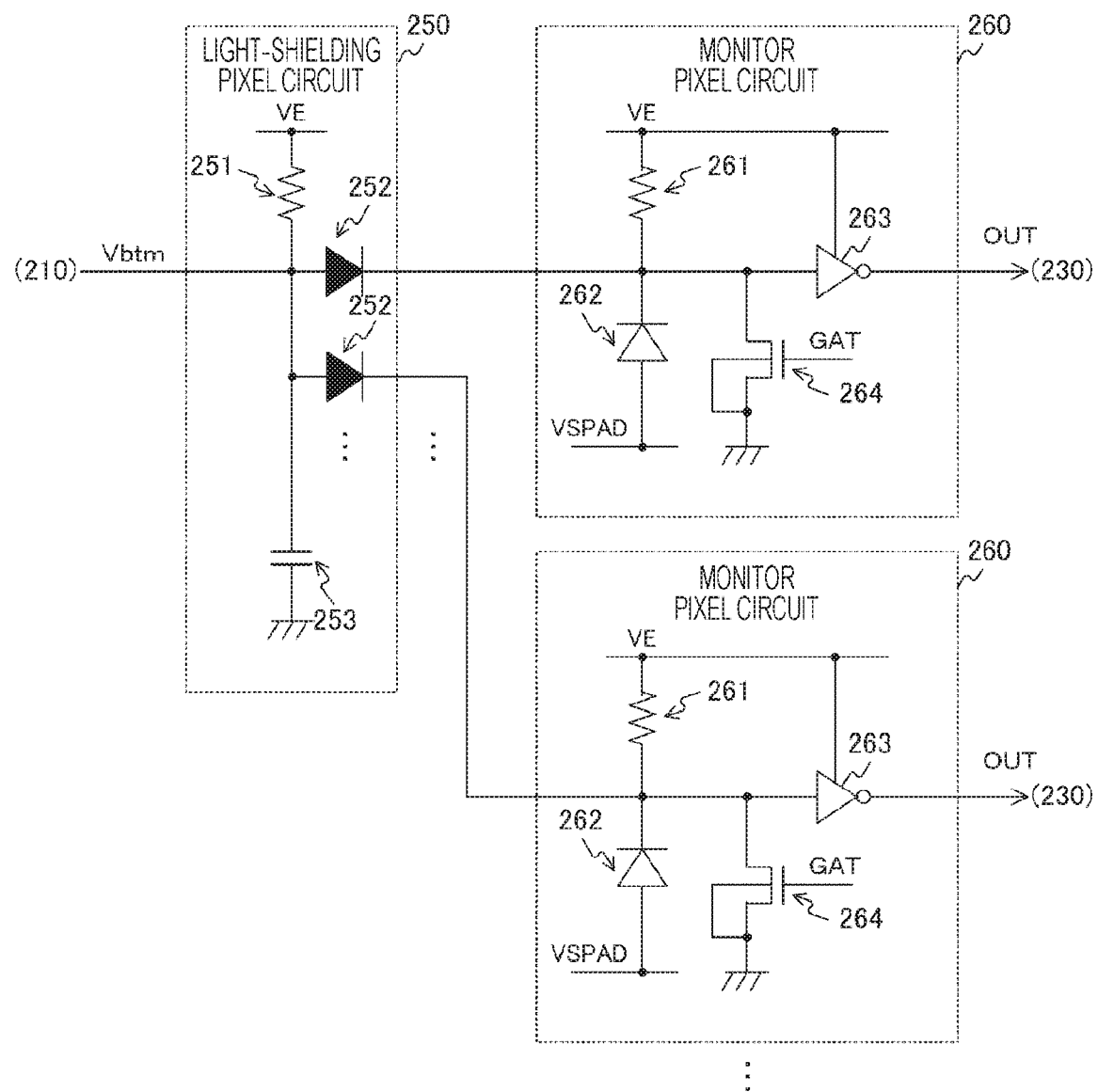
FIG. 14 is an example of a circuit diagram of a light-shielding pixel circuit and a monitor pixel circuit according to the second embodiment of the present technology.

FIG. 14 is an example of a circuit diagram of a light-shielding pixel circuit 250 and the monitor pixel circuits 260 according to the second embodiment of the present technology. The M monitor pixel circuits 260 are commonly connected to the light-shielding pixel circuit 250. The light-shielding pixel circuit 250 is provided with a diode 252 for each monitor pixel circuit 260.

Respective cathodes of the diodes 252 are connected to the corresponding monitor pixel circuits 260, and anodes of the diodes 252 are commonly connected to a connection point of a resistor 251 and a capacitor 253.

With the above configuration, the light-shielding pixel circuit 250 can detect a minimum value of a cathode potential of each of the plurality of monitor pixel circuits 260 as a bottom potential Vbtm.

As described above, according to the second embodiment of the present technology, a solid-state image sensor 200 detects the minimum value of the cathode potential of each of the plurality of monitor pixel circuits 260, thereby controlling an excess bias to an appropriate value even if a failure occurs in any of the monitor pixel circuits 260.

3. Third Embodiment

In the above-described first embodiment, the solid-state image sensor 200 has detected the bottom potential Vbtm using the light-shielding pixel circuit 250 provided with the capacitor 253 and the diode 252. However, there is a possibility of an increase in circuit scale due to addition of the circuit such as the capacitor 253. From the viewpoint of reducing a mounting area of the solid-state image sensor 200, a small circuit scale is desirable. A pixel array unit 240 of a third embodiment is different from that of the first embodiment in that a monitor pixel circuit 260 detects a bottom potential Vbtm instead of a light-shielding pixel circuit 250.

Figure 15:
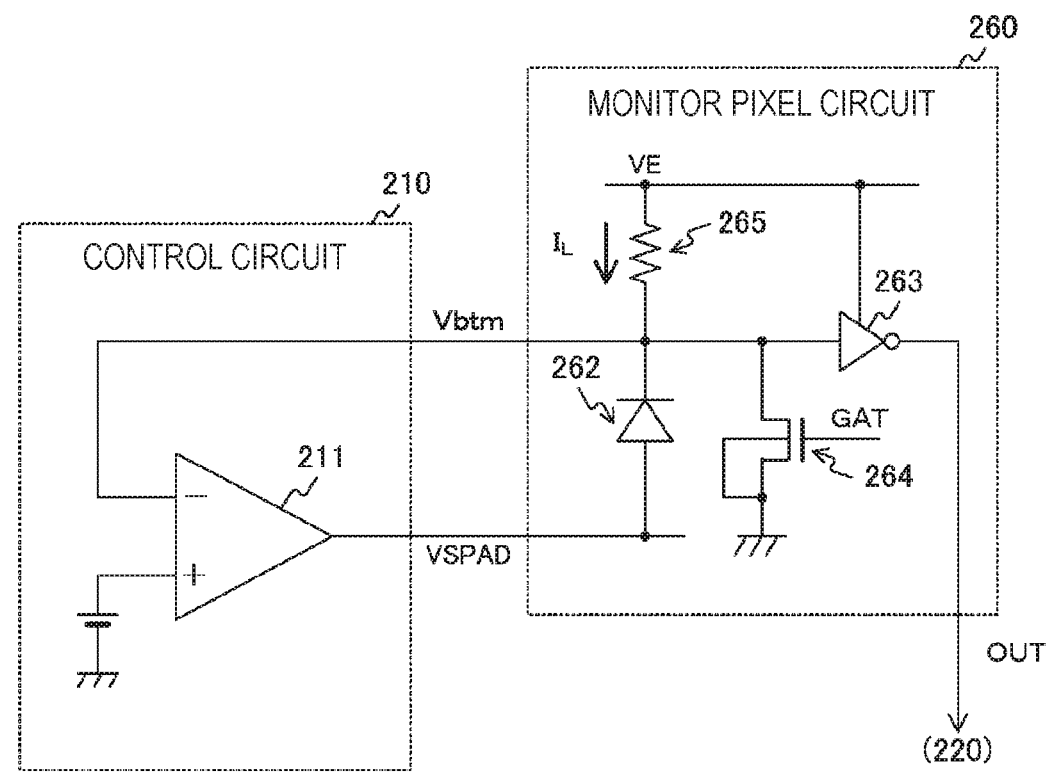
FIG. 15 is an example of a circuit diagram of a control circuit and a monitor pixel circuit according to a third embodiment of the present technology.

FIG. 15 is an example of a circuit diagram of a control circuit 210 and the monitor pixel circuit 260 according to the third embodiment of the present technology. The monitor pixel circuit 260 of the third embodiment is different from that of the first embodiment in that a resistor 265 is provided instead of the resistor 261. Furthermore, a cathode of a photodiode 262 is connected to an inverting input terminal (−) of a comparator 211. Furthermore, the control circuit 210 is not provided with a correction diode 212, and the light-shielding pixel circuit 250 is not provided with a capacitor 253 and a diode 252.

A resistance value of the resistor 265 is smaller than that of a resistor 281 in the non-monitor pixel circuit 280, and is set to a value at which an avalanche breakdown occurs even in a dark state where no light enters the photodiode 262. Thereby, a value of a photocurrent $I_L$ is fixed (in other words, latched) to a similar value to a value at the incidence of light even in the dark state. Therefore, a potential of a cathode is fixed to a bottom potential Vbtm, and the control circuit 210 can control an anode potential VSPAD according to the potential.

As described above, according to the third embodiment of the present technology, the monitor pixel circuit 260 detects the bottom potential Vbtm, and thus the capacitor 253 and the diode 252 can be reduced. Thereby, the circuit scale of the pixel array unit 240 can be reduced.

4. Fourth Embodiment

In the above-described first embodiment, the solid-state image sensor 200 has detected the bottom potential Vbtm using the light-shielding pixel circuit 250 provided with the capacitor 253 and the diode 252. However, there is a possibility of an increase in circuit scale due to addition of the circuit such as the capacitor 253. From the viewpoint of reducing a mounting area of the solid-state image sensor 200, a small circuit scale is desirable. A solid-state image sensor 200 of a fourth embodiment is different from that of the first embodiment in that a control circuit 210 estimates a bottom potential Vbtm from an output value of a monitor pixel circuit 260.

Figure 16:
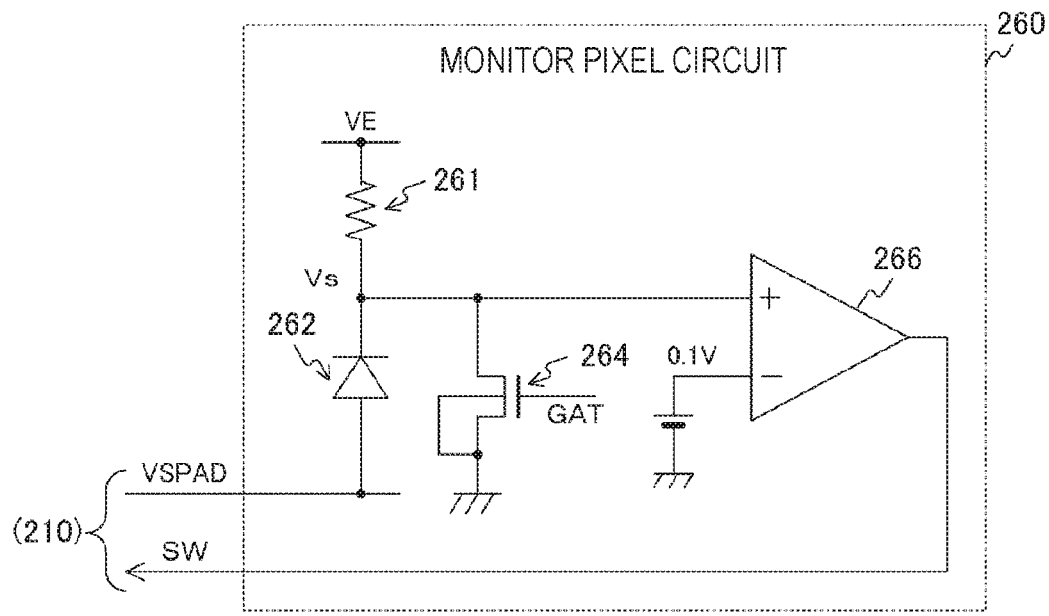
FIG. 16 is an example of a circuit diagram of a monitor pixel circuit according to a fourth embodiment of the present technology.

FIG. 16 is an example of a circuit diagram of a monitor pixel circuit 260 according to the fourth embodiment of the present technology. The monitor pixel circuit 260 of the fourth embodiment is different from that of the first embodiment in including a comparator 266 instead of the inverter 263. Furthermore, a cathode of a photodiode 262 is not connected to a light-shielding pixel circuit 250, and the light-shielding pixel circuit 250 is not provided with a capacitor 253 and a diode 252.

A non-inverting input terminal (+) of the comparator 266 is connected to a cathode of the photodiode 262, and an inverting input terminal (−) of the comparator 266 is connected to a power supply terminal having a predetermined potential (such as 0.1 volts). The comparator 266 compares a potential of the cathode with a predetermined potential and supplies a comparison result to the control circuit 210 as a switching signal SW. The switching signal SW becomes at a high level in a case where a cathode potential Vs is higher than the predetermined potential, and becomes at a low level in a case where the cathode potential Vs is equal to or lower than the predetermined potential.

Figure 17:
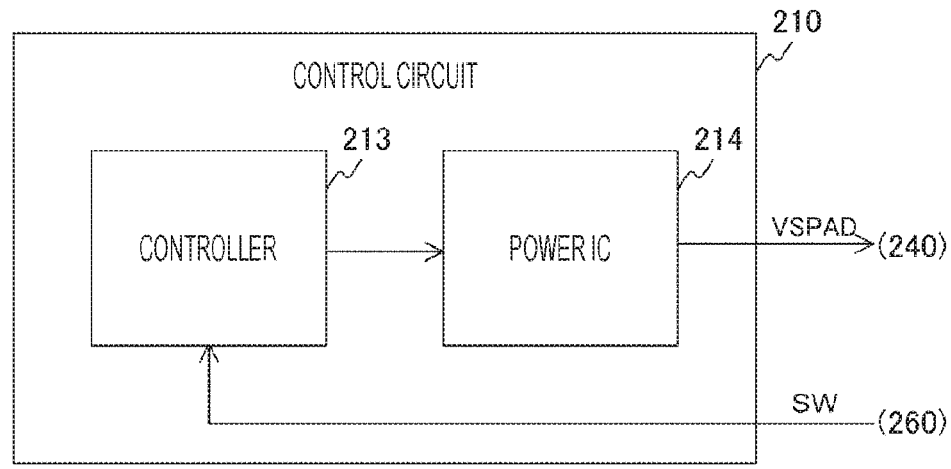
FIG. 17 is a block diagram illustrating a configuration example of a control circuit according to the fourth embodiment of the present technology.

FIG. 17 is a block diagram illustrating a configuration example of the control circuit 210 according to the fourth embodiment of the present technology. The control circuit 210 includes a controller 213 and a power integrated circuit (IC) 214 instead of the comparator 211 and the correction diode 212.

The controller 213 controls a potential supplied by the power IC 214 according to the switching signal SW. Details of control content will be described below. The power IC 214 supplies an anode potential VSPAD according to the control of the controller 213.

Figure 18:
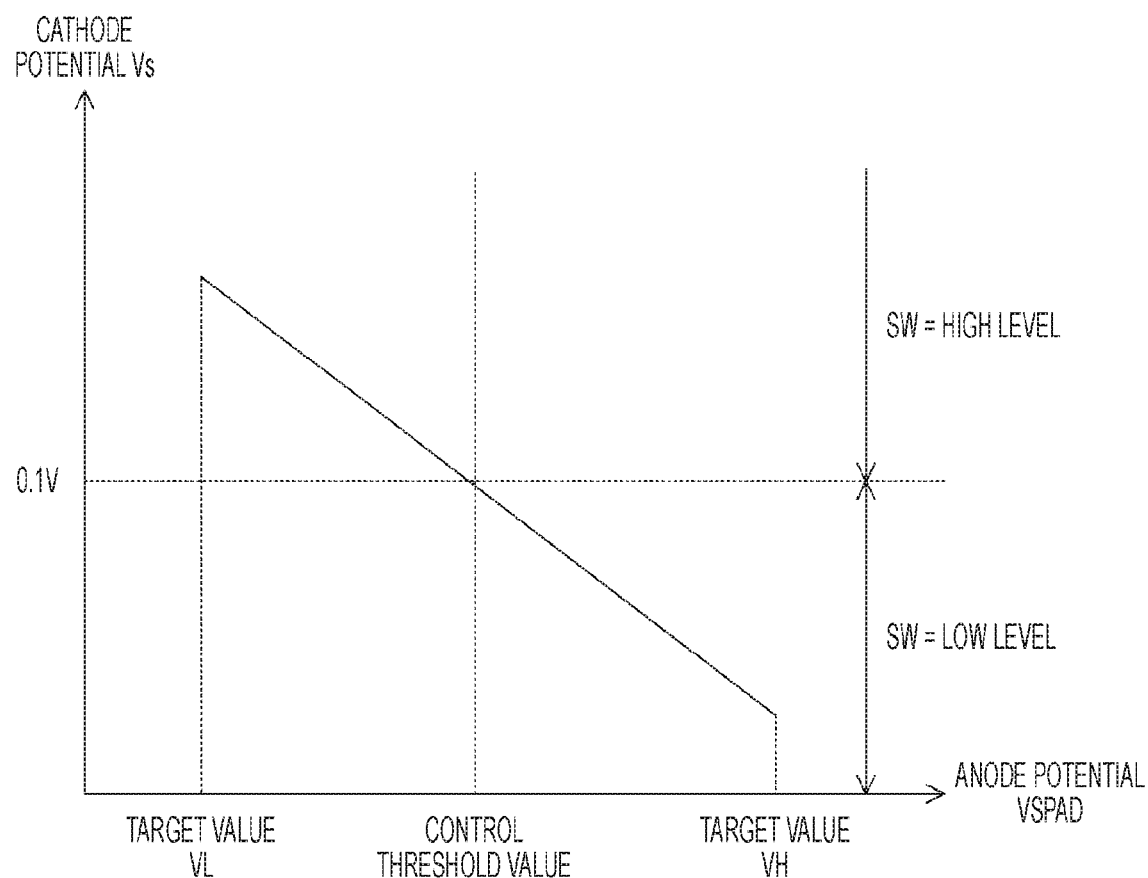
FIG. 18 is a graph illustrating an example of a relationship between a cathode potential and an anode potential according to the fourth embodiment of the present technology.

FIG. 18 is a graph illustrating an example of a relationship between a cathode potential and an anode potential according to the fourth embodiment of the present technology. In FIG. 18, the vertical axis represents the cathode potential Vs, and the horizontal axis represents the anode potential VSPAD.

In a case where the switching signal SW is at a high level (that is, the cathode potential Vs is higher than the predetermined potential), the bottom potential Vbtm is estimated not to be less than a threshold value VT. At this time, the controller 213 causes the power IC 214 to supply a target value VL. On the other hand, in a case where the switching signal SW is at a low level (that is, the cathode potential Vs is equal to or lower than the predetermined potential), the bottom potential Vbtm is estimated to be less than the threshold value VT. At this time, the controller 213 causes the power IC 214 to supply a target value VH. This target value VH is set to a value higher than the target value VL. By the control according to the switching signal SW, a lower anode potential VSPAD is supplied as the bottom potential Vbtm is higher.

As described above, according to the fourth embodiment of the present technology, the control circuit 210 estimates the bottom potential Vbtm from the comparison result between the cathode potential Vs and the predetermined potential, and thus the capacitor 253 and the diode 252 can be reduced. Thereby, the circuit scale of the pixel array unit 240 can be reduced.

5. Fifth Embodiment

In the above-described first embodiment, the solid-state image sensor 200 has detected the bottom potential Vbtm using the light-shielding pixel circuit 250 provided with the capacitor 253 and the diode 252. However, there is a possibility of an increase in circuit scale due to addition of the circuit such as the capacitor 253. From the viewpoint of reducing a mounting area of the solid-state image sensor 200, a small circuit scale is desirable. A solid-state image sensor 200 of a fifth embodiment differs from that of the first embodiment in that a control circuit 210 estimates a bottom potential Vbtm from a count value of a pulse signal OUT of a monitor pixel circuit 260.

Figure 19:
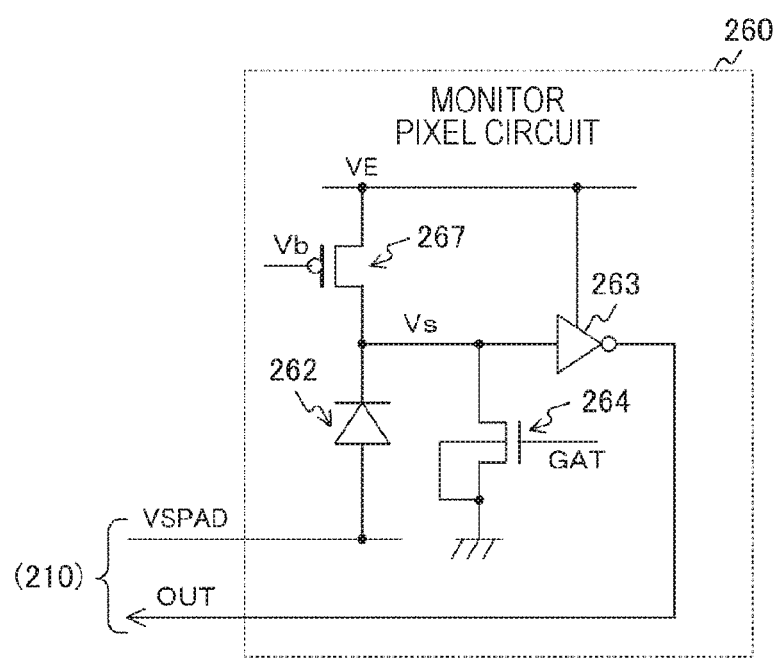
FIG. 19 is an example of a circuit diagram of a monitor pixel circuit according to a fifth embodiment of the present technology.

FIG. 19 is an example of a circuit diagram of the monitor pixel circuit 260 according to the fifth embodiment of the present technology. The monitor pixel circuit 260 in the fifth embodiment is different from that of the first embodiment in that a transistor 267 is provided instead of the resistor 261, and an inverter 263 supplies the pulse signal OUT to the control circuit 210. Furthermore, a cathode of a photodiode 262 is not connected to a light-shielding pixel circuit 250, and the light-shielding pixel circuit 250 is not provided with a capacitor 253 and a diode 252.

For example, as the transistor 267, a pMOS transistor is used. Furthermore, a low-level bias voltage Vb is applied to a gate of the transistor 267. Note that an on-resistance of the transistor 267 is an example of a resistor described in the claims.

Figure 20:
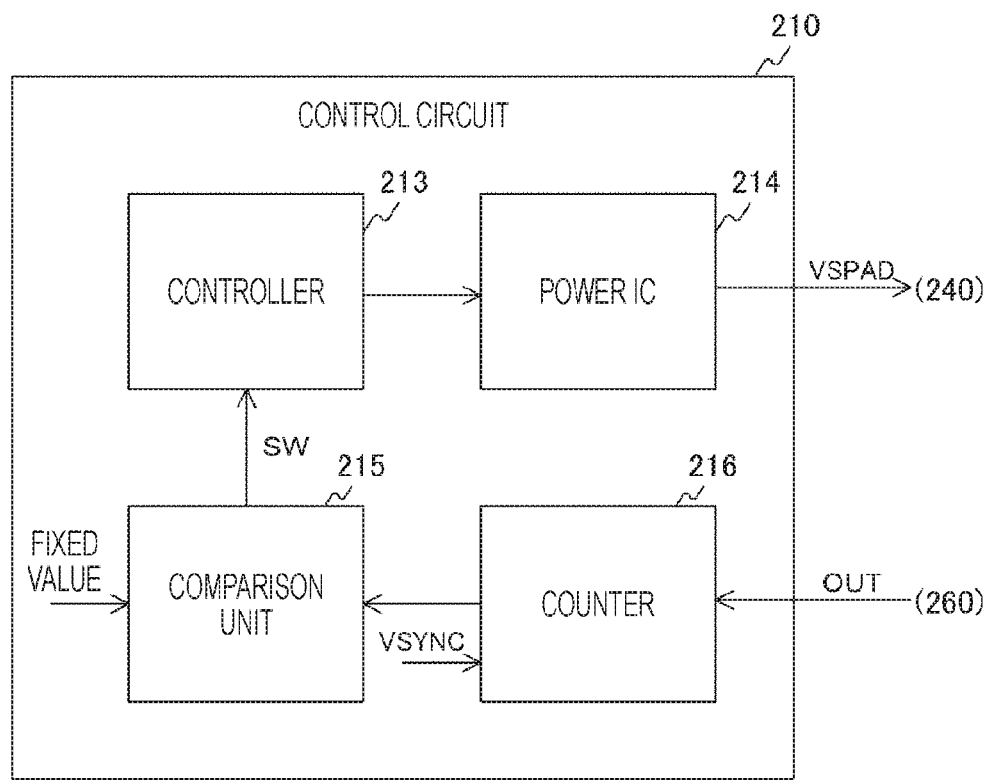
FIG. 20 is a block diagram illustrating a configuration example of a control circuit according to the fifth embodiment of the present technology.

FIG. 20 is a block diagram illustrating a configuration example of the control circuit 210 according to the fifth embodiment of the present technology. The control circuit 210 of the fifth embodiment is different from that of the first embodiment in including a controller 213, a power IC 214, a comparison unit 215, and a counter 216 instead of the comparator 211 and the correction diode 212.

The counter 216 counts the number of times of when the pulse signal OUT becomes at a high level within a period of a vertical synchronization signal VSYNC. The counter 216 supplies a count value to the comparison unit 215.

The comparison unit 215 compares the count value with a predetermined fixed value. The comparison unit 215 supplies a comparison result to the controller 213 as a switching signal SW. For example, the switching signal SW becomes at a high level in a case where the count value is larger than the fixed value, and becomes at a low level in a case where the count value is equal to or smaller than the fixed value.

The controller 213 controls a potential supplied by the power IC 214 according to the switching signal SW. Details of control content will be described below. The power IC 214 supplies an anode potential VSPAD according to the control of the controller 213.

Figure 21:
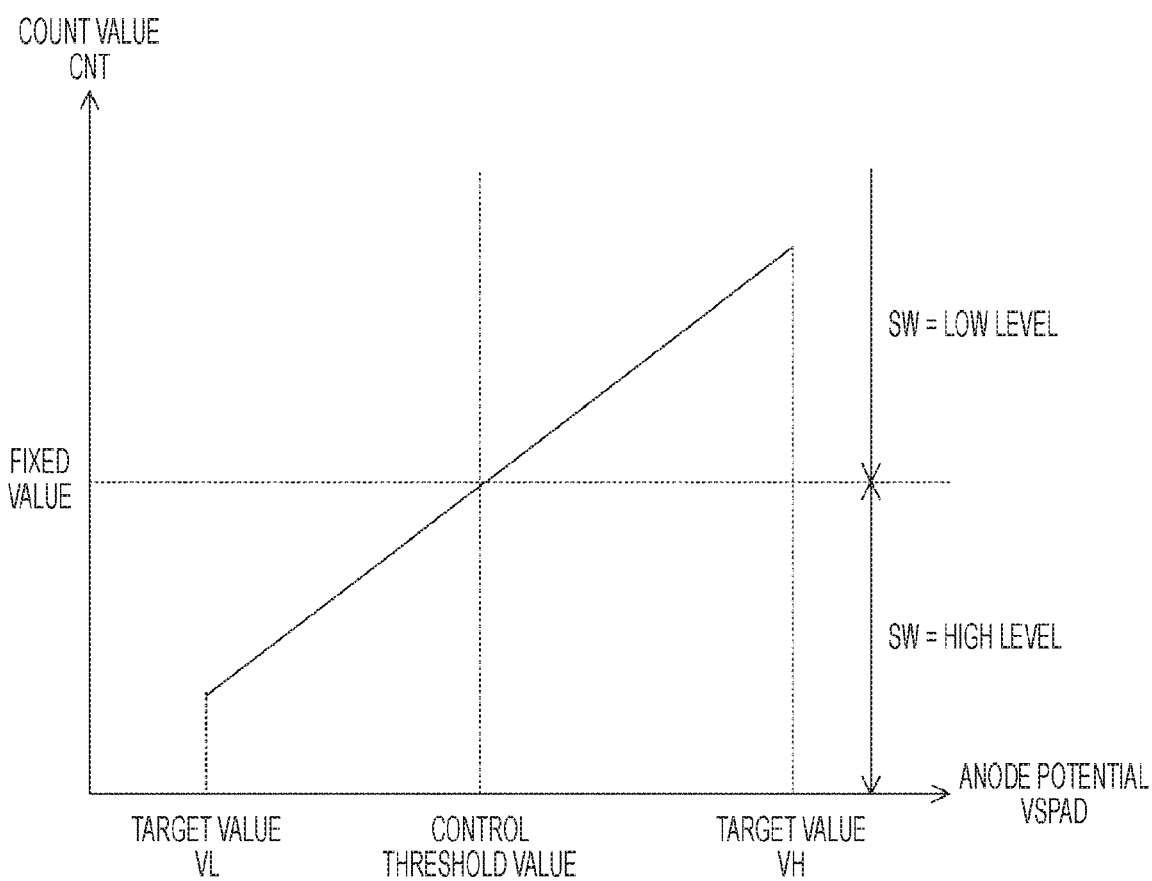
FIG. 21 is a graph illustrating an example of a relationship between a count value and an anode potential according to the fifth embodiment of the present technology.

FIG. 21 is a graph illustrating an example of a relationship between the count value and the anode potential according to the fifth embodiment of the present technology. In FIG. 21, the vertical axis represents the count value, and the horizontal axis represents the anode potential VSPAD.

The switching signal SW being at a low level (that is, the count value being the fixed value or less) means that the number of times of when the bottom potential Vbtm becomes less than the threshold value VT is small. At this time, the controller 213 causes the power IC 214 to supply a target value VL. On the other hand, the switching signal SW being at a high level (that is, the count value being larger than the fixed value) means that the number of times of when the bottom potential Vbtm becomes less than the threshold value VT is large. At this time, the controller 213 causes the power IC 214 to supply a target value VH. This target value VH is set to a value higher than the target value VL.

As described above, according to the fifth embodiment of the present technology, the control circuit 210 controls the anode potential VSPAD on the basis of the comparison result between the count value according to the bottom potential Vbtm and the fixed value, and thus the capacitor 253 and the diode 252 can be reduced. Thereby, the circuit scale of the pixel array unit 240 can be reduced.

6. Sixth Embodiment

In the above-described first embodiment, the solid-state image sensor 200 has detected the bottom potential Vbtm using the light-shielding pixel circuit 250 provided with the capacitor 253 and the diode 252. However, there is a possibility of an increase in circuit scale due to addition of the circuit such as the capacitor 253. From the viewpoint of reducing a mounting area of the solid-state image sensor 200, a small circuit scale is desirable. A solid-state image sensor 200 of a sixth embodiment is different from that of the first embodiment in that a control circuit 210 estimates a bottom potential Vbtm from a pulse width of a monitor pixel circuit 260.

Figure 22:
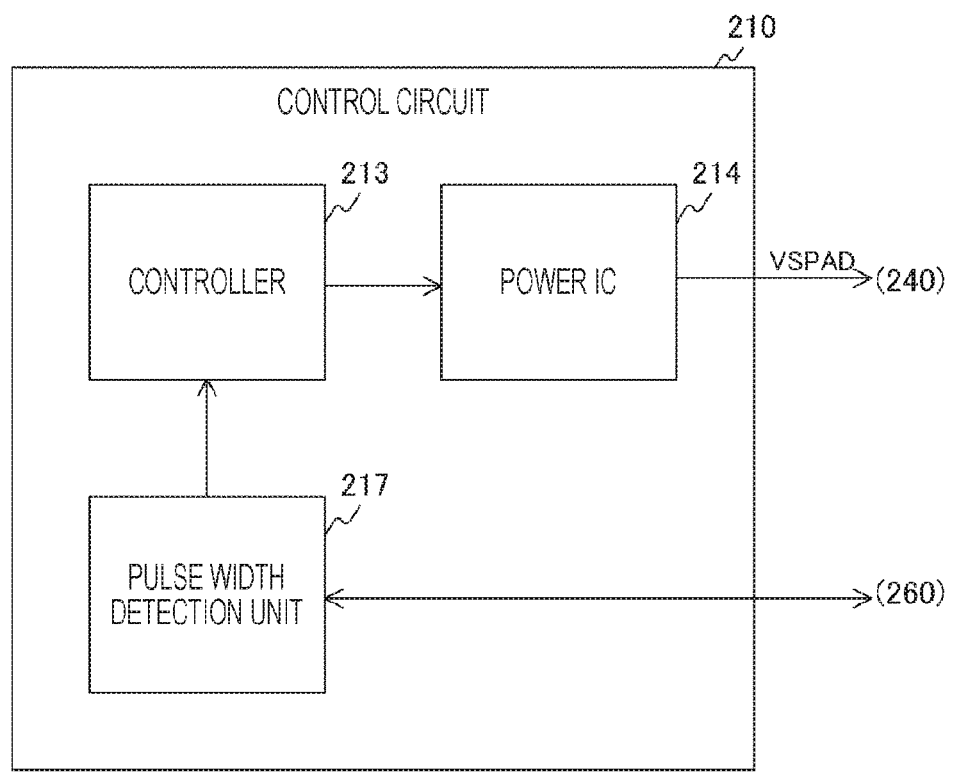
FIG. 22 is a block diagram illustrating a configuration example of a control circuit according to a sixth embodiment of the present technology.

FIG. 22 is a block diagram illustrating a configuration example of the control circuit 210 according to the sixth embodiment of the present technology. The control circuit 210 of the sixth embodiment is different from that of the first embodiment in including a controller 213, a power IC 214, and a pulse width detection unit 217 instead of the comparator 211 and the correction diode 212. Furthermore, a cathode of a photodiode 262 is not connected to a light-shielding pixel circuit 250, and the light-shielding pixel circuit 250 is not provided with a capacitor 253 and a diode 252.

The pulse width detection unit 217 detects a pulse width of a pulse signal OUT from the monitor pixel circuit 260. The pulse width detection unit 217 supplies the detected pulse width to the controller 213.

The controller 213 controls a potential supplied from the power IC 214 on the basis of the pulse width. Details of control content will be described below. The power IC 214 supplies an anode potential VSPAD according to the control of the controller 213.

Figure 23:
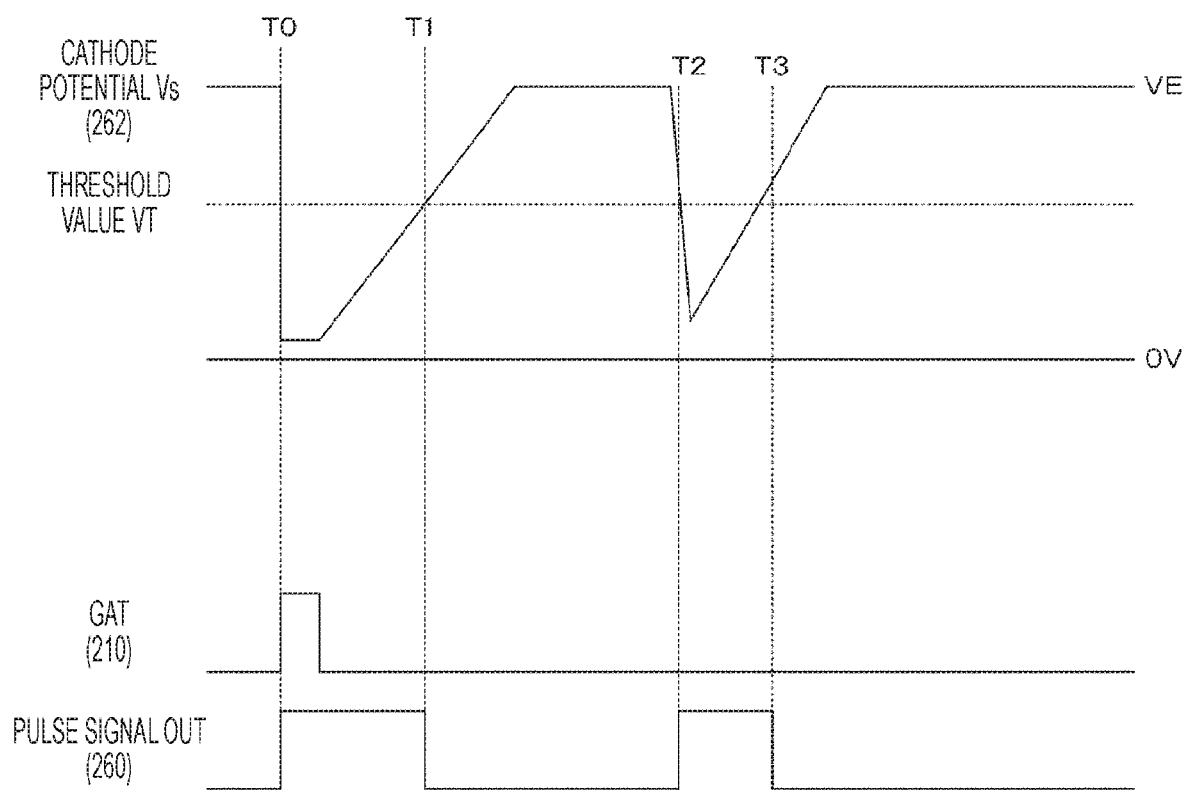
FIG. 23 is a timing chart illustrating an example of operations of the control circuit and a monitor pixel circuit according to the sixth embodiment of the present technology.

FIG. 23 is a timing chart illustrating an example of operations of the control circuit 210 and the monitor pixel circuit 260 according to the sixth embodiment of the present technology.

The pulse width detection unit 217 supplies a high-level gate signal GAT over a predetermined pulse period at the start of distance measurement or before the start of distance measurement. At this time, the controller 213 holds the pulse width detected by the pulse width detection unit 217 as a reference value.

Then, each time reflected light is received, the pulse width detection unit 217 detects the pulse width, and the controller 213 compares the pulse width with the reference value. This pulse width tends to become wider as the bottom potential Vbtm is lower. The controller 213 causes the power IC 214 to supply a target value VL in a case where the pulse width is wider than the reference value on the basis of the tendency. On the other hand, in a case where the pulse width is equal to or smaller than the reference value, the controller 213 causes the power IC 214 to supply a target value VH. This target value VH is set to a value higher than the target value VL.

As described above, according to the sixth embodiment of the present technology, the control circuit 210 controls the anode potential VSPAD on the basis of the comparison result between the pulse width according to the bottom potential Vbtm and the reference value, and thus the capacitor 253 and the diode 252 can be reduced. Thereby, the circuit scale of the pixel array unit 240 can be reduced.

7. Seventh Embodiment

In the above-described first embodiment, the control circuit 210 has controlled the anode potential VSPAD using the comparator 211 that is an analog circuit. However, since an analog circuit is generally larger in circuit scale than a digital circuit, a mounting area may increase. A control circuit 210 of a seventh embodiment is different from that of the first embodiment in that an anode potential VSPAD is controlled by a digital circuit.

Figure 24:
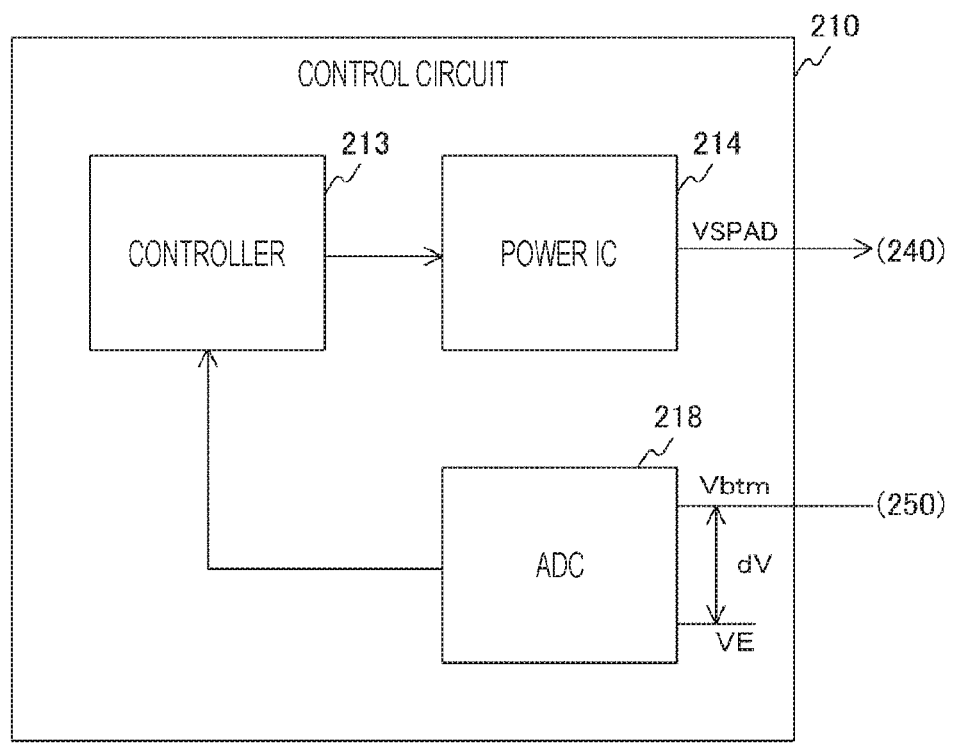
FIG. 24 is a block diagram illustrating a configuration example of a control circuit according to a seventh embodiment of the present technology.

FIG. 24 is a block diagram illustrating a configuration example of the control circuit 210 according to the seventh embodiment of the present technology. The control circuit 210 is different from that of the first embodiment in including a controller 213, a power IC 214, and an analog to digital converter (ADC) 218 instead of the comparator 211 and the correction diode 212.

The ADC 218 receives an excess bias dV that is a difference between a potential VE and a bottom potential Vbtm. The ADC 218 performs analog to digital (AD) conversion for the excess bias dV and supplies a digital signal to the controller 213. Since the potential VE is constant, the excess bias dV takes a higher value as the bottom potential Vbtm is lower.

The controller 213 controls a potential supplied from the power IC 214 on the basis of the excess bias dV. The controller 213 causes the power IC 214 to supply a lower anode potential VSPAD as the excess bias dV is lower (that is, the bottom potential Vbtm is higher). The power IC 214 supplies the anode potential VSPAD according to the control of the controller 213.

As described above, in the seventh embodiment of the present technology, the control circuit 210 controls the anode potential VSPAD by the controller 213 and the power IC 214. Therefore, the circuit scale can be reduced as compared with a case of using an analog circuit.

8. Eighth Embodiment

In the above-described seventh embodiment, the solid-state image sensor 200 has only one monitor pixel circuit 260 disposed in the pixel array unit 240, but there is a possibility of a failure of the monitor pixel circuit 260 due to, for example, deterioration over time, and the pixel becomes a defective pixel. A pixel array unit 240 of an eighth embodiment is different from that of the seventh embodiment in arranging a plurality of monitor pixel circuits 260 and enabling any one of the monitor pixel circuits 260.

In the pixel array unit 240 of the eighth embodiment, the plurality of monitor pixel circuits 260 is arranged as in the second embodiment illustrated in FIG. 13.

Figure 25:
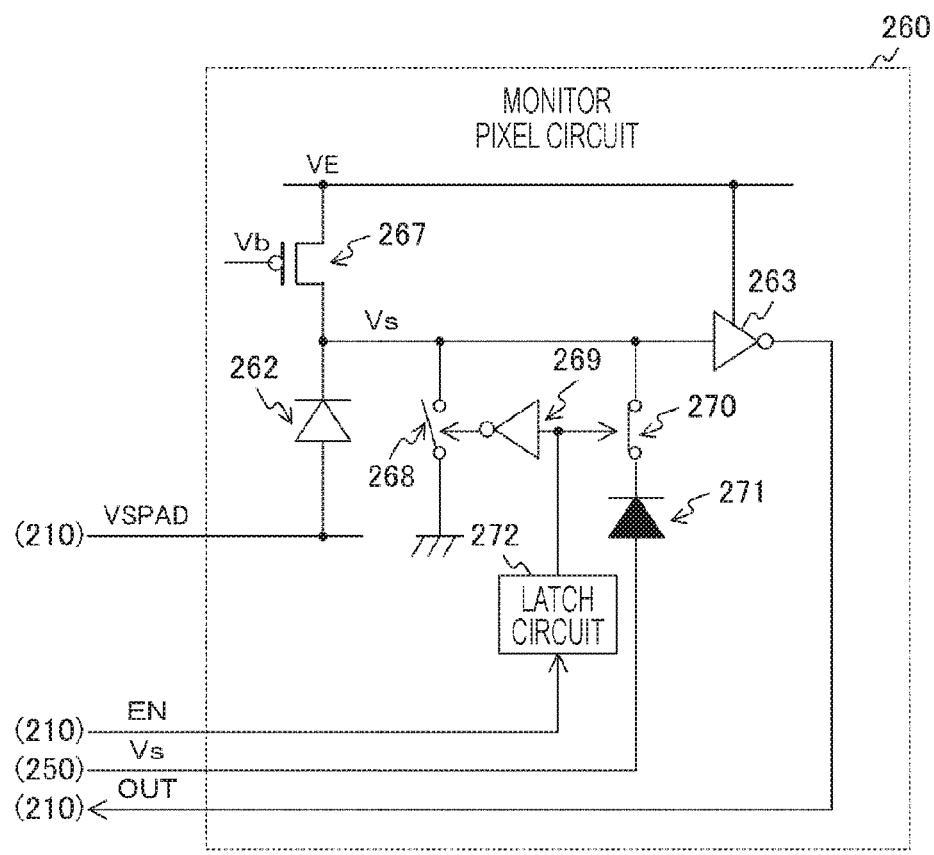
FIG. 25 is an example of a circuit diagram of a monitor pixel circuit according to an eighth embodiment of the present technology.

FIG. 25 is an example of a circuit diagram of the monitor pixel circuit 260 according to the eighth embodiment of the present technology. The monitor pixel circuit 260 of the eighth embodiment is different from that of the seventh embodiment in including a transistor 267 instead of the resistor 261. Furthermore, the monitor pixel circuit 260 of the eighth embodiment is different from that of the seventh embodiment in including switches 268 and 270, an inverter 269, a diode 271, and a latch circuit 272 instead of the transistor 264.

For example, as the transistor 267, a pMOS transistor is used. Furthermore, a low-level bias voltage Vb is applied to a gate of the transistor 267. Note that an on-resistance of the transistor 267 is an example of a resistor described in the claims.

The latch circuit 272 holds an enable signal EN from the control circuit 210. The enable signal EN is a signal for enabling or disabling the monitor pixel circuit 260. For example, the enable signal EN is set to a high level in a case of enabling the monitor pixel circuit 260, and is set to a low level in a case of disabling the monitor pixel circuit 260.

The inverter 269 inverts the enable signal EN held in the latch circuit 272 and outputs the inverted enable signal EN to the switch 268 as an inverted signal.

The switch 268 opens and closes a path between a cathode of a photodiode 262 and a ground terminal according to the inverted signal from the inverter 269. For example, the switch 268 moves to a closed state in the case where the inverted signal is at a high level, and moves to an open state in the case where the inverted signal is at a low level.

The switch 270 opens and closes a path between the cathode of the photodiode 262 and a cathode of the diode 271 according to the enable signal EN held in the latch circuit 272. For example, the switch 270 moves to a closed state in the case where the enable signal EN is at a high level, and moves to an open state in the case where the enable signal EN is at a low level. An anode of the diode 271 is connected to the light-shielding pixel circuit 250.

The controller 213 of the eighth embodiment selects and enables any one of the plurality of monitor pixel circuits 260 by the enable signal EN, and disables the remaining monitor pixel circuits 260. The enabled monitor pixel circuit 260 supplies a cathode potential Vs to the light-shielding pixel circuit 250, the cathode potential Vs having a potential that drops due to incident light. Meanwhile, the disabled monitor pixel circuit 260 has no avalanche breakdown in the photodiode 262 by discharge from the switch 268 in the closed state, and does not output the cathode potential Vs by the switch 270 in the open state.

Furthermore, the controller 213 periodically switches the enabled monitor pixel circuit 260. For example, the enabled monitor pixel circuit 260 is switched every period of a vertical synchronization signal VSYNC. Since the avalanche breakdown does not occur in the photodiode 262 of the disabled monitor pixel circuit 260, the deterioration of the photodiode 262 can be suppressed by periodically enabling only any one of the monitor pixel circuits 260 as compared with the case of always enabling all the monitor pixel circuits 260.

As described above, in the eighth embodiment of the present technology, the control circuit 210 enables any one of the plurality of monitor pixel circuits 260 and controls the anode potential VSPAD. Therefore, deterioration of the photodiode 262 can be suppressed as compared with the case of enabling all the monitor pixel circuits 260.

9. Ninth Embodiment

In the above-described first embodiment, the light-shielding pixel circuit 250 has detected the bottom potential Vbtm. However, as illustrated in FIG. 8, there is a possibility of occurrence of an error in the value of the bottom potential Vbtm. A monitor pixel circuit 260 of a ninth embodiment is different from that of the first embodiment in adding a variable capacitor to reduce an error of a bottom potential Vbtm.

Figure 26:
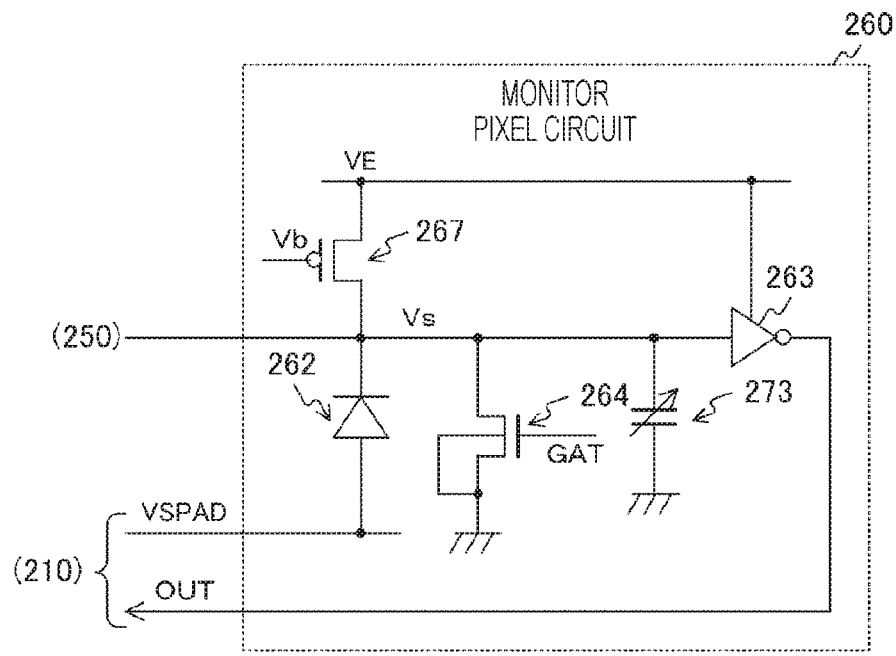
FIG. 26 is an example of a circuit diagram of a monitor pixel circuit according to a ninth embodiment of the present technology.

FIG. 26 is an example of a circuit diagram of a monitor pixel circuit 260 according to the ninth embodiment of the present technology. The monitor pixel circuit 260 of the ninth embodiment is different from that of the first embodiment in including a transistor 267 instead of the resistor 261 and further including a variable capacitor 273.

For example, as the transistor 267, a pMOS transistor is used. Furthermore, a low-level bias voltage Vb is applied to a gate of the transistor 267. Note that an on-resistance of the transistor 267 is an example of a resistor described in the claims.

The variable capacitor 273 is a capacitor having a variable capacitance value. One end of the variable capacitor 273 is connected to a cathode of a photodiode 262, and the other end of the variable capacitor 273 is connected to a ground terminal.

Since the variable capacitor 273 is connected in parallel with a capacitor 253 in a light-shielding pixel circuit 250, a combined capacitance thereof is larger than that of a case of the capacitor 253 alone. For this reason, the addition of the variable capacitor 273 can reduce the error of the bottom potential Vbtm. A capacitance value of the variable capacitor 273 is adjusted by a user or the like before distance measurement.

Figure 27:
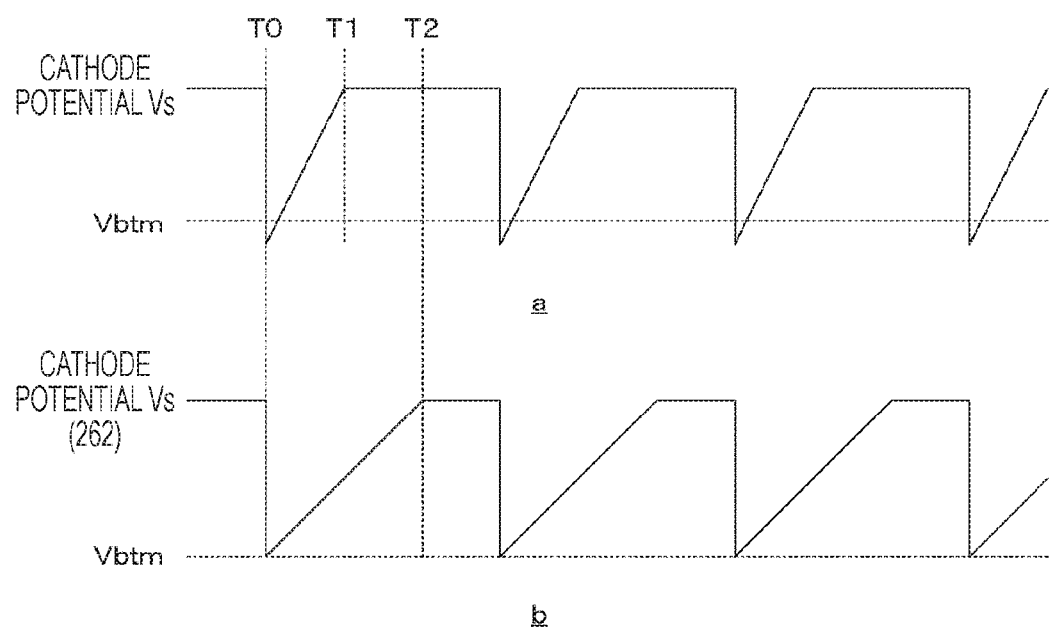
FIG. 27 is a timing chart illustrating an example of a bottom potential according to the ninth embodiment of the present technology.

FIG. 27 is a timing chart illustrating an example of a bottom potential according to the ninth embodiment of the present technology. a in FIG. 27 illustrates a timing chart illustrating an example of the bottom potential detected in a comparative example without the variable capacitor 273. b in FIG. 27 illustrates a timing chart illustrating an example of the bottom potential detected in the ninth embodiment.

In the comparative example, the bottom potential Vbtm detected by the light-shielding pixel circuit 250 does not coincide with an actual minimum value (that is, a true value) of a cathode potential Vs, and an error occurs. Meanwhile, in the ninth embodiment, the bottom potential Vbtm substantially coincides with the true value, and the error is reduced.

As described above, in the ninth embodiment of the present technology, the variable capacitor 273 is connected in parallel with the capacitor 253, and thus the circuit capacitance can be increased as compared with a case of using only the capacitor 253. Thereby, the error of the bottom potential Vbtm can be reduced.

10. Tenth Embodiment

In the above-described first embodiment, the light-shielding pixel circuit 250 has detected the bottom potential Vbtm. However, as illustrated in FIG. 8, there is a possibility of occurrence of an error in the value of the bottom potential Vbtm. A monitor pixel circuit 260 of a tenth embodiment is different from that of the first embodiment in reducing an error of a bottom potential Vbtm by applying a refresh pulse signal.

Figure 28:
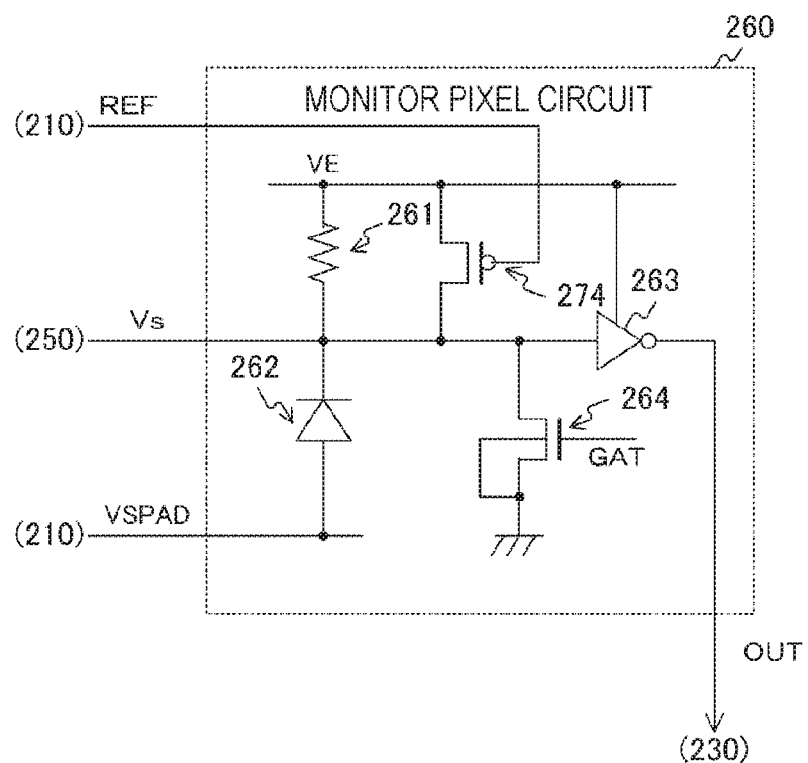
FIG. 28 is an example of a circuit diagram of a monitor pixel circuit according to a tenth embodiment, of the present technology.

FIG. 28 an example of a circuit diagram of a monitor pixel circuit 260 according to the tenth embodiment of the present technology. The tenth monitor pixel circuit 260 is different from that of the first embodiment in further including a transistor 274.

For example, as the transistor 274, a pMOS transistor is used. The transistor 274 short-circuits both ends of a resistor 261 according to a refresh pulse signal REF.

Figure 29:
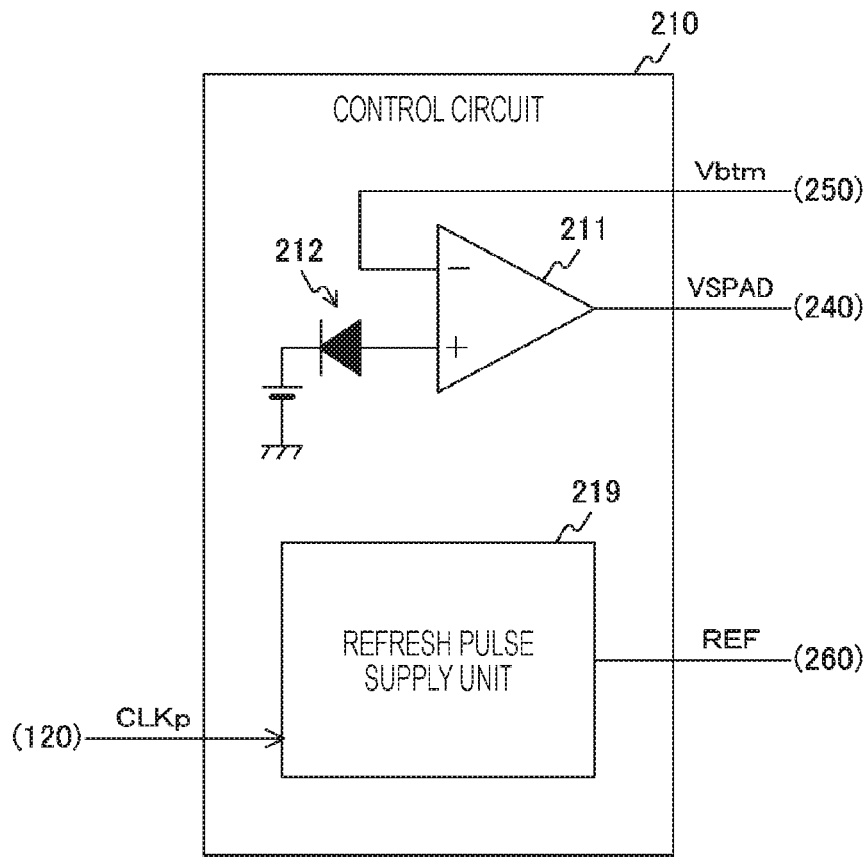
FIG. 29 is a block diagram illustrating a configuration example of a control circuit according to the tenth embodiment of the present technology.

FIG. 29 is an example of a circuit diagram of a control circuit 210 according to the tenth embodiment of the present technology. The control circuit 210 of the tenth embodiment is different from that of the first embodiment in further including a refresh pulse supply unit 219.

The refresh pulse supply unit 219 supplies the refresh pulse signal REF to the monitor pixel circuit 260 in synchronization with a light emission control signal CLKp.

Figure 30:
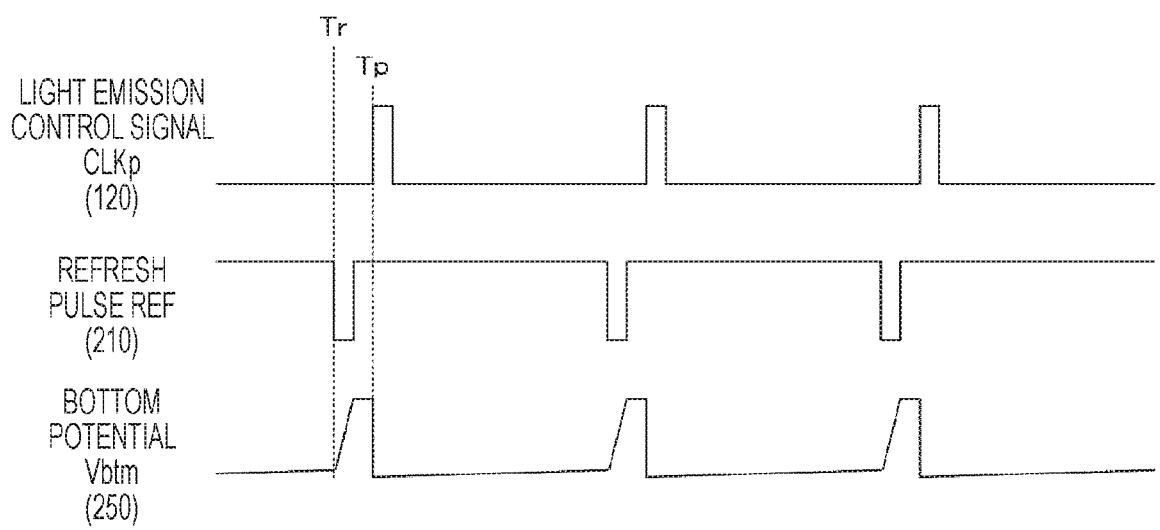
FIG. 30 is a timing chart illustrating an example of fluctuations in a light emission control signal, a refresh pulse signal, and a bottom potential according to the tenth embodiment of the present technology.

FIG. 30 is a timing chart illustrating an example of fluctuations in the light emission control signal CLKp, the refresh pulse signal REF, and a bottom potential Vbtm according to the tenth embodiment of the present technology.

At timing Tr immediately before rising timing Tp of the light emission control signal CLKp, the refresh pulse supply unit 219 supplies the low-level refresh pulse signal REF over a certain pulse period. Except for the pulse period, the refresh pulse signal REF is set to a high level. By the low-level refresh pulse signal REF, the bottom potential Vbtm rises to the potential VE, and the capacitor 253 is charged. Since a discharge time of the capacitor 253 is shortened by the period from the timing Tr to Tp, the amount of fluctuation of the bottom potential Vbtm due to the discharge becomes small, and the error of the bottom potential Vbtm is reduced.

As described above, in the tenth embodiment of the present technology, the control circuit 210 supplies the refresh pulse signal REF to charge the capacitor 253. Therefore, the discharge time of the capacitor 253 can be shortened accordingly. Thereby, the error of the bottom potential Vbtm can be reduced.

11. Eleventh Embodiment

In the above-described first embodiment, the control circuit 210 has controlled the anode potential VSPAD according to the bottom potential Vbtm. However, the sensitivity of the photodiode 262 may fluctuate due to a temperature change. Due to this fluctuation in sensitivity, the detection efficiency of incident light may be reduced. A control circuit 210 of an eleventh embodiment is different from that of the first embodiment in controlling an anode potential VSPAD according to a temperature.

Figure 31:
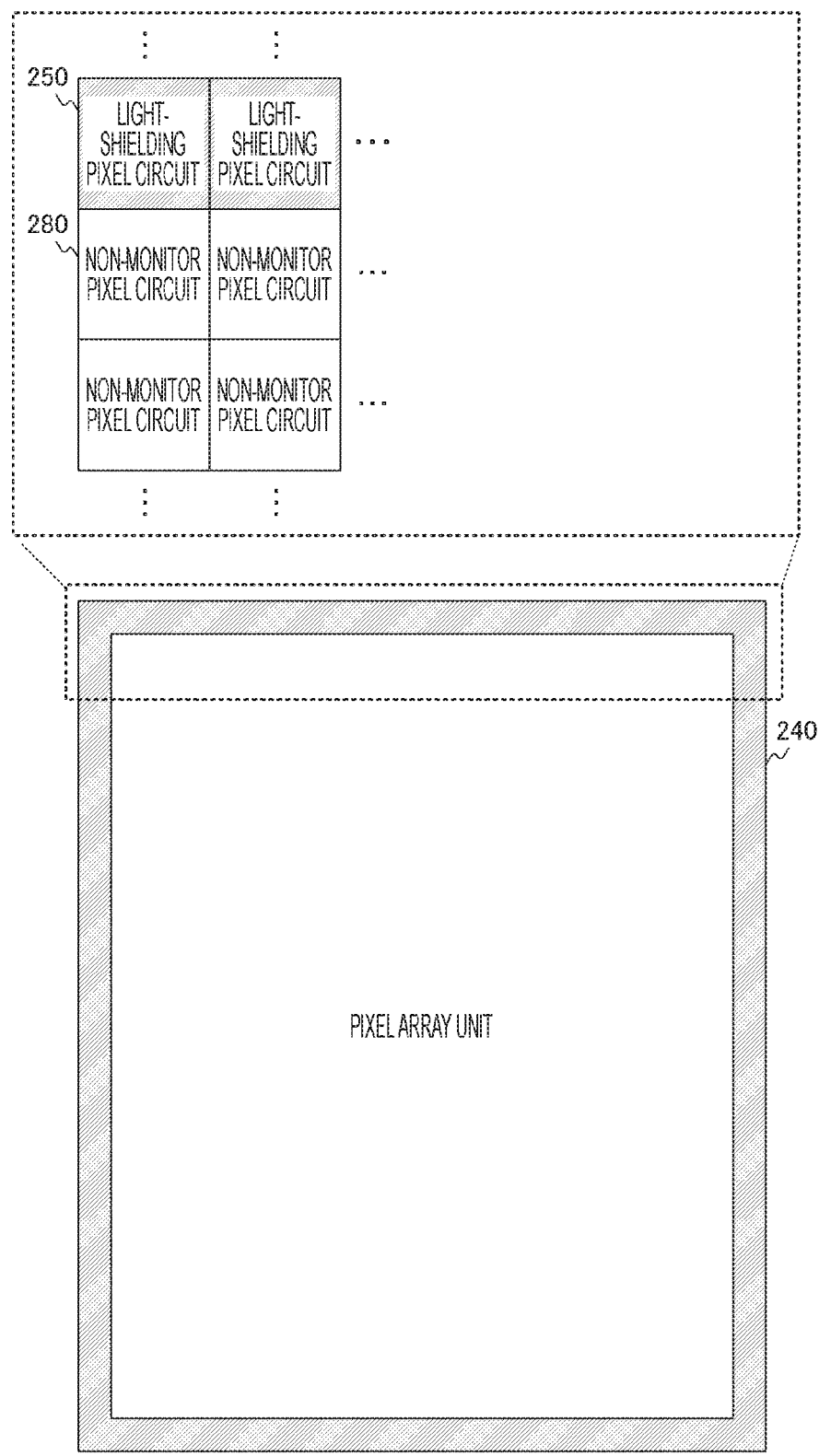
FIG. 31 is an example of a plan view of a pixel array unit according to an eleventh embodiment of the present technology.

FIG. 31 is an example of a plan view of a pixel array unit 240 according to the eleventh embodiment of the present technology. The pixel array unit 240 of the eleventh embodiment is different from that of the first embodiment in that monitor pixel circuits 260 are not arrayed.

Figure 32:
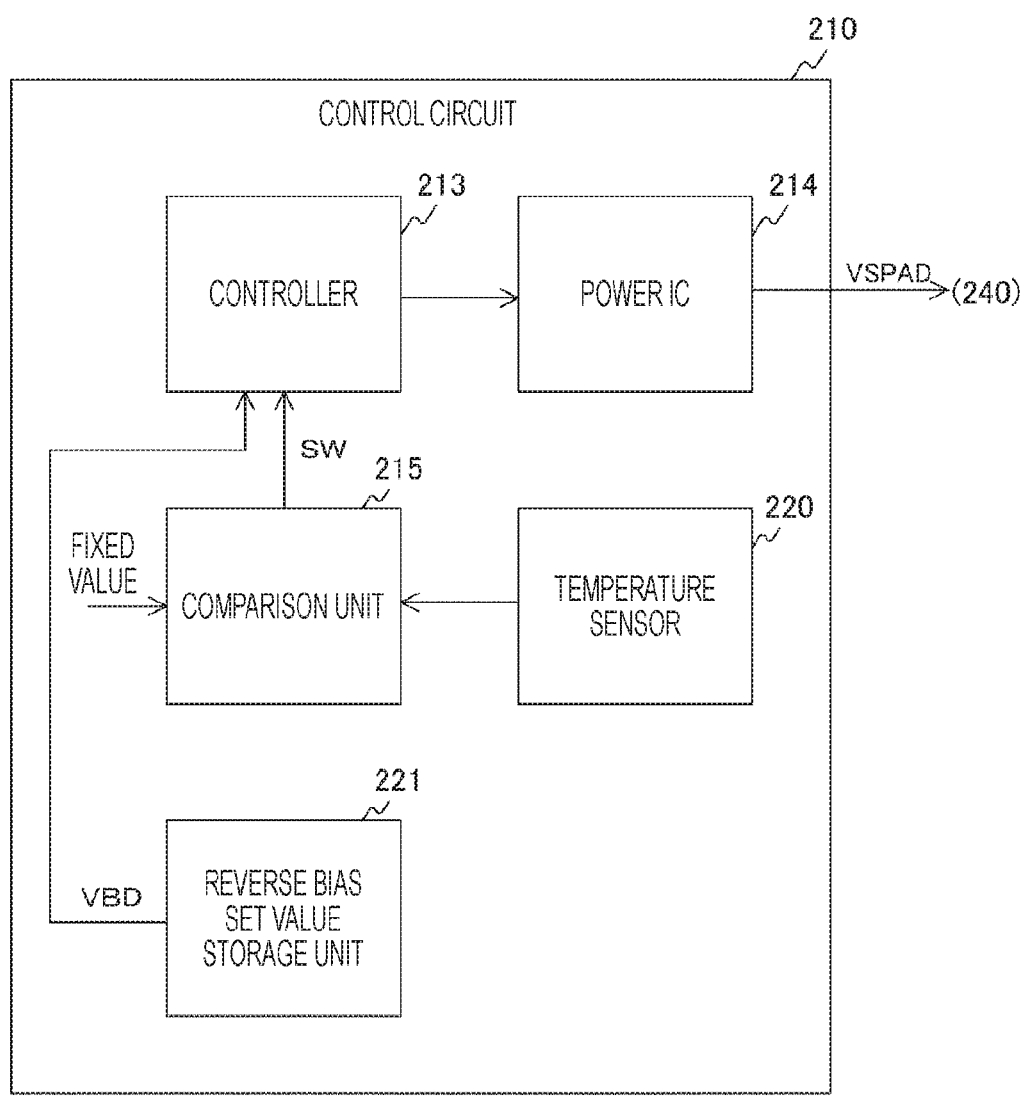
FIG. 32 is a block diagram illustrating a configuration example of a control circuit, according to the eleventh embodiment of the present technology.

FIG. 32 is a block diagram illustrating a configuration example of the control circuit 210 according to the eleventh embodiment of the present technology. The control circuit 210 of the eleventh embodiment includes a controller 213, a power IC 214, a comparison unit 215, a temperature sensor 220, and a reverse bias set value storage unit 221.

The temperature sensor 220 measures the temperature in a distance measuring module 100. The temperature sensor 220 supplies a measurement value to the comparison unit 215. The comparison unit 215 compares the measurement value with a predetermined fixed value and supplies a comparison result to the controller 213 as a switching signal SW. In a case where the temperature is higher than the fixed value, for example, the switching signal SW is set to a high level, and in a case where the temperature is equal to or lower than the fixed value, the switching signal SW is set to a low level.

The reverse bias set value storage unit 221 stores a breakdown voltage measured in advance as a set value VBD.

The controller 213 controls a potential suppled by the power IC 214 on the basis of the temperature and the set value VBD. Details of control content will be described below. The power IC 214 supplies an anode potential VSPAD according to the control of the controller 213.

Figure 33:
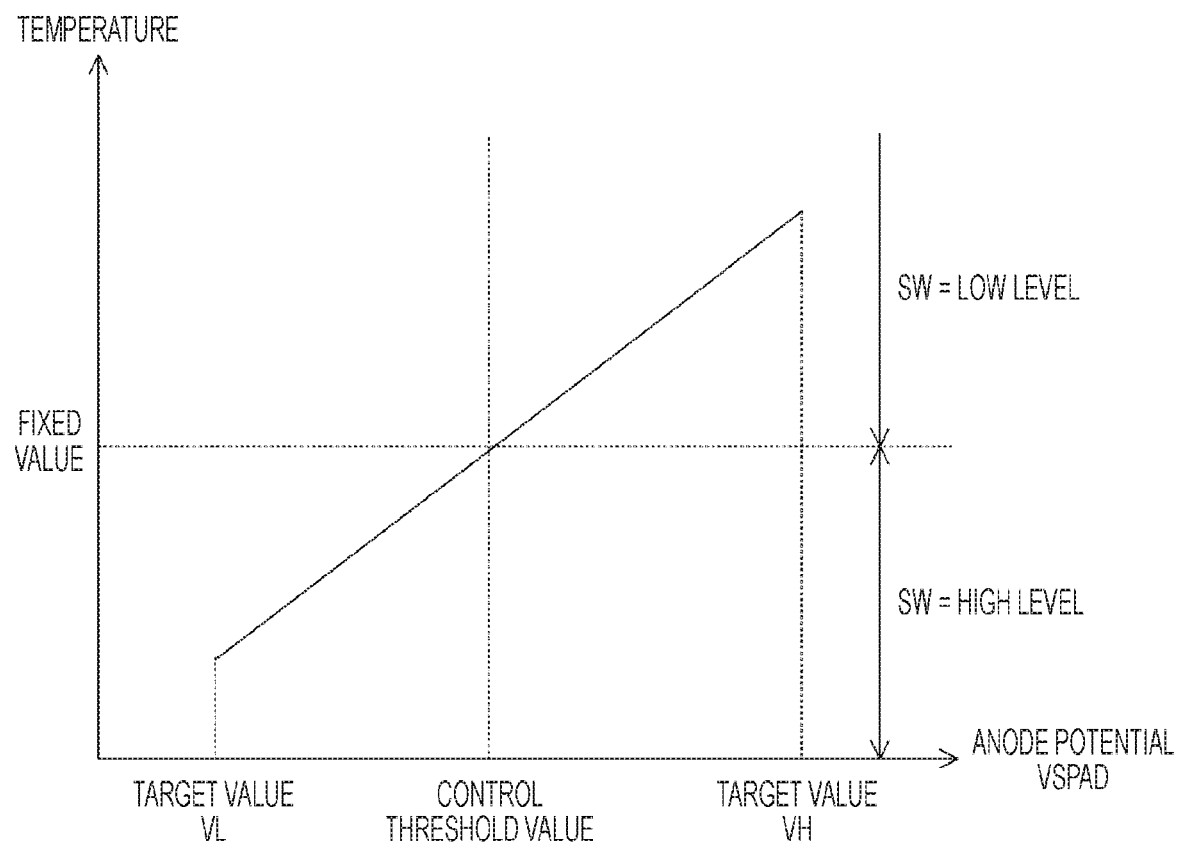
FIG. 33 is a graph illustrating an example of a relationship between temperature and an anode potential according to the eleventh embodiment of the present technology.

FIG. 33 is a graph illustrating an example of a relationship between temperature and an anode potential according to the eleventh embodiment of the present technology. In FIG. 33, the vertical axis represents the measured temperature, and the horizontal axis represents the anode potential VSPAD.

In a case where the switching signal SW is at a high level (that is, the temperature is higher than the fixed value), the controller 213 sets a target value VL by the following expression and supplies the target value VL to the power IC 214.

$VL = VE - (VBD + dVH)$

In the above expression, dVH represents an excess bias of when the temperature is relatively high.

Meanwhile, in a case where the switching signal SW is at a low level (that is, the temperature is equal to or lower than the fixed value), the controller 213 sets a target value VH by the following expression and supplies the target value VH to the power IC 214.

$VH = VE - (VBD + dVL)$

In the above expression, dVL represents the excess bias of when the temperature is relatively low, and is set to a value lower than dVH.

As described above, in the eleventh embodiment of the present technology, the control circuit 210 controls the anode potential VSPAD according to the temperature. Therefore, even if the sensitivity of the photodiode 262 fluctuates due to a temperature change, the detection efficiency of incident light can be maintained.

12. Application Example to Mobile Body

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 34:
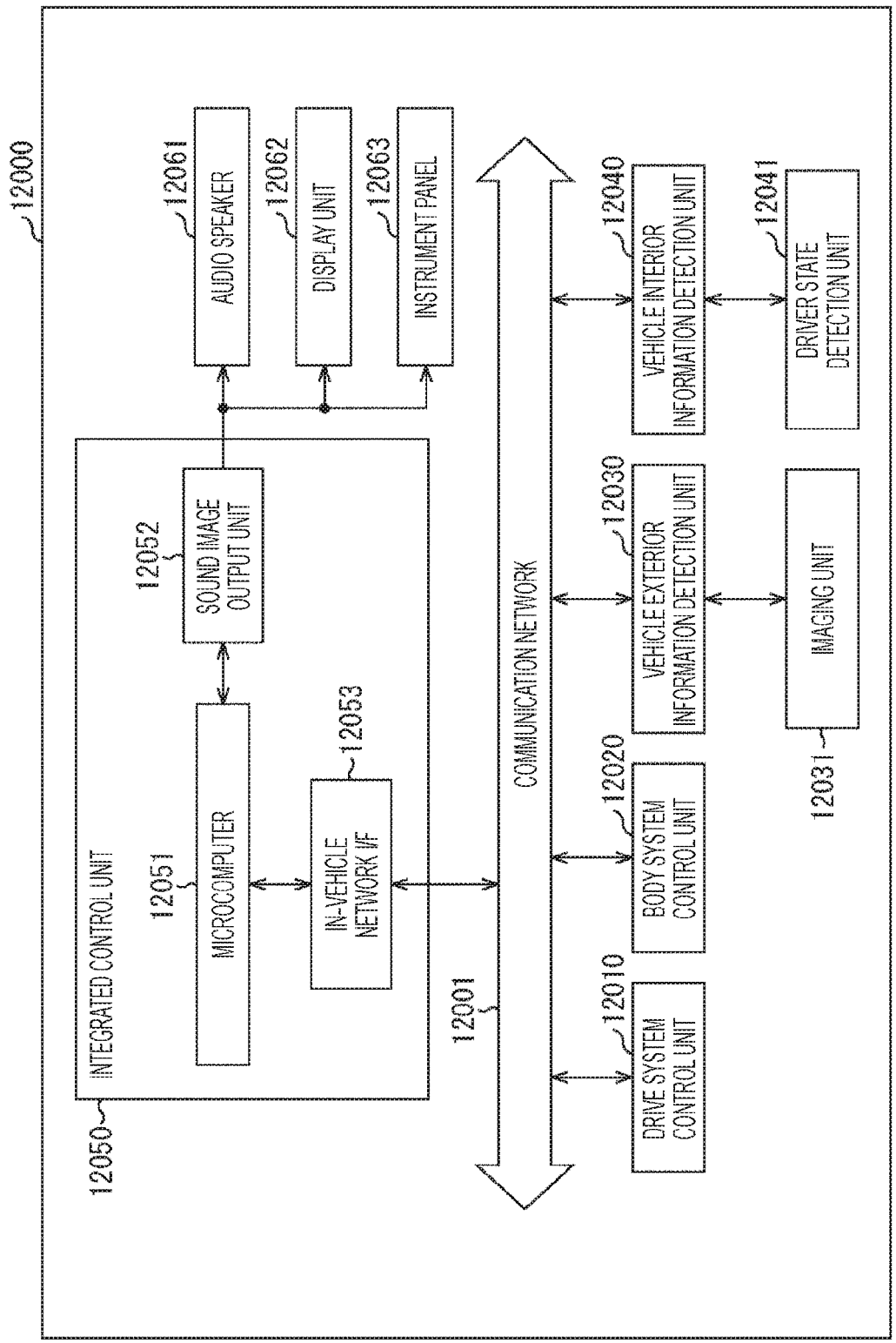
FIG. 34 is a block diagram illustrating a schematic configuration example of a vehicle control system.

FIG. 34 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 34, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the imaged image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realizing the function of an advanced driver assistance system (ADAS) function including collision avoidance or shock mitigation of the vehicle, following travel based on an inter-vehicle distance, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 34, as the output device, an audio speaker 12061, a display unit 12062, and an instrument panel 12063 are exemplarily illustrated. The display unit 12062 may include, for example, at least one of an on-board display or a head-up display.

Figure 35:
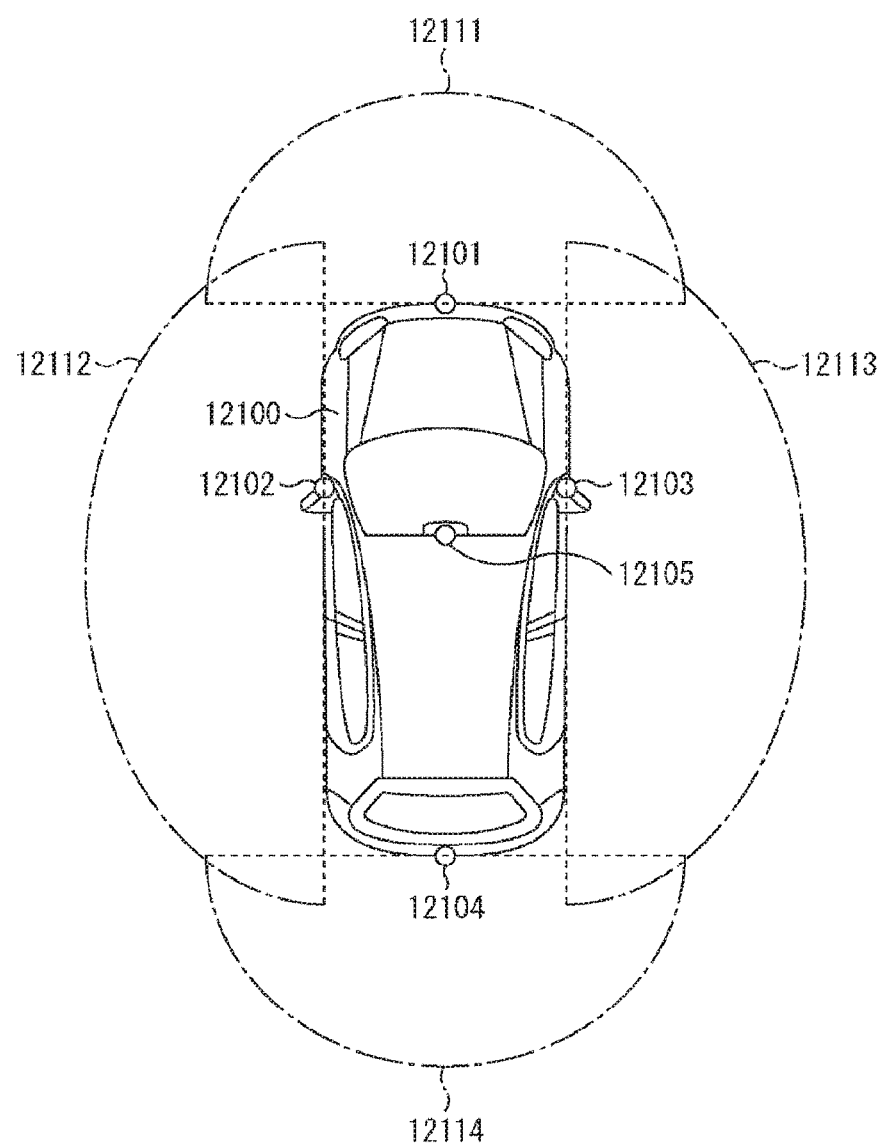
FIG. 35 is an explanatory diagram illustrating an example of installation positions of imaging units.

FIG. 35 is a diagram illustrating an example of an installation position of the imaging unit 12031.

In FIG. 35, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire front images of the vehicle 12100. The imaging units 12102 and 12103 provided at the side mirrors mainly acquire side images of the vehicle 12100. The imaging unit 12104 provided at the rear bumper or the back door mainly acquires a rear image of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 35 illustrates an example of imaging ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal changes of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic drive of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the imaged images of the imaging units 12101 to 12104, thereby to recognize the pedestrian. The recognition of a pedestrian is performed by a process of extracting characteristic points in the imaged images of the imaging units 12101 to 12104, as the infrared camera, for example, and by a process of performing pattern matching processing for the series of characteristic points indicating a contour of an object and discriminating whether or not the object is a pedestrian. When the microcomputer 12051 determines that a pedestrian exists in the imaged images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the vehicle exterior information detection unit 12030, of the above-described configurations. Specifically, the distance measuring module 100 in FIG. 1 can be applied to the vehicle exterior information detection unit 12030. By applying the technology according to the present disclosure to the vehicle exterior information detection unit 12030, an anode potential can be controlled to an appropriate value at which the erroneous count rate becomes small and the photon detection efficiency becomes sufficiently high, and accurate distance information can be obtained.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Further, the processing procedures described in the above embodiments may be regarded as a method having these series of procedures, and also regarded as a program for causing a computer to execute these series of procedures and as a recording medium for storing the program. As this recording medium, for example, a compact disc (CD), a mini disc (MD), a digital versatile disc (DVD), a memory card, a Blu-ray disc (Blu-ray (registered trademark) disc), or the like can be used.

Note that the effects described in the present specification are merely examples and are not limited, and other effects may be exhibited.

Note that the present technology can also have the following configurations.

(1) A solid-state image sensor including:
  a photodiode configured to photoelectrically convert incident light and output a photocurrent;
  a resistor connected to a cathode of the photodiode; and
  a control circuit configured to supply a lower potential to an anode of the photodiode as a potential of the cathode of when the photocurrent flows through the resistor is higher.

(2) The solid-state image sensor according to (1), further including:
  a detection circuit configured to detect the potential of the cathode of when the photocurrent flows through the resistor and supply the detected potential to the control circuit.

(3) The solid-state image sensor according to (2), in which
  the resistor and the photodiode are disposed in each of a plurality of pixel circuits,
  the respective cathodes of the plurality of pixel circuits are commonly connected to the detection circuit, and
  the detection circuit detects a minimum value of the respective potentials of the cathodes of when the photocurrent flows through the resistor.

(4) The solid-state image sensor according to (2) or (3), further including:
  a variable capacitor connected to the cathode.

(5) The solid-state image sensor according to any one of (2) to (4), further including:
  a transistor configured to short-circuit both ends of the resistor according to a refresh pulse signal, in which
  the control circuit further supplies the refresh pulse signal to the transistor immediately before incidence of the incident light.

(6) The solid-state image sensor according to (1), in which
  a resistance value of the resistor is a value at which the potential of the cathode is fixed.

(7) The solid-state image sensor according to (1) further including:
  a comparator configured to compare the potential of the cathode with a predetermined potential and output a comparison result, in which
  the control circuit supplies, to the anode, a lower potential than a potential of a case where the potential of the cathode is less than the predetermined potential, in a case where the potential of the cathode is higher than the predetermined potential, on the basis of the comparison result.

(8) The solid-state image sensor according to (1), in which
  the control circuit counts a number of times of when the potential of the cathode becomes lower than a predetermined threshold value in a predetermined period, and supplies, to the anode, a lower potential than a potential of a case where the number of times is larger than a predetermined number of times, in a case where the number of times is less than the predetermined number of times.

(9) The solid-state image sensor according to (1), further including:
an inverter configured to invert a signal of the potential of the cathode and output the signal as a pulse signal, in which
the control circuit supplies a lower potential to the anode of the photodiode as a pulse width of the pulse signal is shorter.

(10) The solid-state image sensor according to (1), in which
one end of the resistor is connected to the cathode and the other end of the resistor is connected to a terminal of a predetermined potential, and
the control circuit measures a voltage between the potential of the cathode and the predetermined potential, and supplies a lower potential to the anode of the photodiode as the voltage is higher.

(11) The solid-state image sensor according to (10), in which
the resistor and the photodiode are disposed in each of a plurality of pixel circuits, and
the control circuit sets any one of the plurality of pixel circuits to be enabled and measures the voltage between the potential of the cathode of the set pixel circuit and the predetermined potential.

(12) A solid-state image sensor including:
a photodiode configured to photoelectrically convert incident light and output a photocurrent;
a resistor connected to a cathode of the photodiode; and
a control circuit configured to measure a temperature and supply a lower potential to an anode of the photodiode as the temperature is lower.

(13) An electronic device including:
a light emitting unit configured to supply irradiation light;
a photodiode configured to photoelectrically convert reflected light with respect to the irradiation light and output a photocurrent;
a resistor connected to a cathode of the photodiode; and
a control circuit configured to supply a lower potential to an anode of the photodiode as a potential of the cathode of when the photocurrent flows through the resistor is higher.

REFERENCE SIGNS LIST

100 Distance measuring module
110 light emitting unit
120 Synchronization control unit
200 Solid-state image sensor
210 Control circuit
211, 266 Comparator
212 Correction diode
213 Controller
214 Power IC
215 Comparison unit
216 Counter
217 Pulse width detection unit
218 ADC
219 Refresh pulse supply unit
220 Temperature sensor
221 Reverse bias set value storage unit
230 Signal processing unit
231 TDC
232 Distance data generation unit
240 Pixel array unit
250 Light-shielding pixel circuit
251, 261, 265, 281 Resistor
252, 271 Diode
253 Capacitor
260 Monitor pixel circuit
262, 282 Photodiode
263, 269, 283 Inverter
264, 267, 274, 284 Transistor
268, 270 Switch
272 Latch circuit
273 Variable capacitor
280 Non-monitor pixel circuit
12030 Vehicle exterior information detection unit

The invention claimed is:
1. A light detecting device, comprising:
first pixel circuitry including a first avalanche photodiode configured to output a first output signal;
second pixel circuitry including a second avalanche photodiode and a buffer circuit, the second pixel circuitry configured to output a second output signal; and
a control circuit including a comparison unit, the control circuit configured to receive the second output signal, wherein
an output of the control circuit is coupled to an anode of the first avalanche photodiode and an anode of the second avalanche photodiode.

2. The light detecting device according to claim 1, wherein the control circuit is configured to receive the second output signal from the second pixel circuitry, and to adjust the output based on the second output signal.

3. The light detecting device according to claim 1, wherein
the second avalanche photodiode is one of a plurality of the second avalanche photodiodes,
the anode is one of a plurality of anodes, each of which corresponds to one of the plurality of second avalanche photodiodes, and
the output of the control circuit is coupled to the plurality of anodes.

4. The light detecting device according to claim 3, wherein the plurality of second avalanche photodiodes are disposed in a row.

5. The light detecting device according to claim 1, wherein
the first pixel circuitry and the second pixel circuitry are arranged in an array, and
a first part of the array is shielded from light.

6. The light detecting device according to claim 5, wherein
a second part of the array is not shielded from light, and
the first avalanche photodiode and the second avalanche photodiode are located in the second part of the array.

7. The light detecting device according to claim 1, wherein the first pixel circuitry includes an inverter and a transistor, one of a source or a drain of the transistor being coupled to a first potential.

8. The light detecting device according to claim 7, wherein the inverter and the other of the source or the drain of the transistor are coupled to a cathode of the first avalanche photodiode.

9. The light detecting device according to claim 1, wherein the second pixel circuitry includes an inverter and a transistor, one of a source or a drain of the transistor being coupled to a first potential.

10. The light detecting device according to claim 1, wherein
the first pixel circuitry includes a first inverter and a first transistor, a source or a drain of the first transistor being coupled to a first potential, and
the second pixel circuitry includes a second inverter and a second transistor, a source or a drain of the second transistor being coupled to a first potential.

11. The light detecting pixel according to claim 1, wherein a distance data is calculated based on the first output signal.

12. An electronic apparatus, comprising:
a light emitting device configured to generate an irradiation light; and
a light receiving device configured to receive a reflected light with respect to the irradiation light, the light receiving device including:
first pixel circuitry including a first avalanche photodiode configured to output a first output signal;
second pixel circuitry including a second avalanche photodiode and a buffer circuit, the second pixel circuitry configured to output a second output signal; and
a control circuit including a comparison unit, the control circuit configured to receive the second output signal, wherein
an output of the control circuit is coupled to an anode of the first avalanche photodiode and an anode of the second avalanche photodiode.

13. The electronic apparatus according to claim 12, wherein
the second avalanche photodiode is one of a plurality of the second avalanche photodiodes,
the anode is one of a plurality of anodes, each of which corresponds to one of the plurality of second avalanche photodiodes, and
the output of the control circuit is coupled to the plurality of anodes.

14. The electronic apparatus according to claim 13, wherein the plurality of second avalanche photodiodes are disposed in a row.

15. The electronic apparatus according to claim 12, wherein
the first pixel circuitry and the second pixel circuitry are arranged in an array, and
a first part of the array is shielded from light.

16. The electronic apparatus according to claim 15, wherein at least a portion of the buffer circuit is located in the first part of the array.

17. The electronic apparatus according to claim 15, wherein
a second part of the array is not shielded from light, and
the first avalanche photodiode and the second avalanche photodiode are located in the second part of the array.

18. The electronic apparatus according to claim 12, wherein
the first pixel circuitry includes a first inverter and a first transistor, and
the second pixel circuitry includes a second inverter and a second transistor.

19. The electronic apparatus according to claim 18, wherein
the first inverter and the first transistor are coupled to a cathode of the first avalanche photodiode, and
the second inverter and the second transistor are coupled to a cathode of the second avalanche photodiode.

20. The electronic apparatus according to claim 12, wherein the light receiving device is configured to measure a round-trip time based on a first timing at which the light emitting device generates the emitted light and a second timing at which the light receiving device receives the reflected light.

21. The electronic apparatus according to claim 12, wherein a distance data is calculated based on the first output signal.

* * * * *